United States Patent
Zhou et al.

(10) Patent No.: US 12,218,646 B2
(45) Date of Patent: Feb. 4, 2025

(54) SURFACE ACOUSTIC WAVE RESONATOR DEVICE AND METHOD FOR MANUFACTURING THE SAME, AND FILTER

(71) Applicant: Shenzhen Newsonic Technologies Co., Ltd., Guangdong (CN)

(72) Inventors: Chencheng Zhou, Guangdong (CN); Jie Zou, Guangdong (CN); Gongbin Tang, Guangdong (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/397,663

(22) Filed: Dec. 27, 2023

(65) Prior Publication Data
US 2024/0186977 A1  Jun. 6, 2024

(51) Int. Cl.
*H03H 9/02* (2006.01)
*H03H 3/08* (2006.01)
*H03H 9/145* (2006.01)
*H03H 9/25* (2006.01)

(52) U.S. Cl.
CPC .......... *H03H 9/02818* (2013.01); *H03H 3/08* (2013.01); *H03H 9/02834* (2013.01); *H03H 9/145* (2013.01); *H03H 9/25* (2013.01)

(58) Field of Classification Search
CPC ............. H03H 9/6483; H03H 9/14541; H03H 9/02992; H03H 9/25; H03H 9/145; H03H 9/02834; H03H 9/02818
See application file for complete search history.

(56) References Cited

U.S. PATENT DOCUMENTS

| | | | |
|---|---|---|---|
| 2006/0131678 A1* | 6/2006 | Yajima | H03H 9/02866 257/416 |
| 2019/0229702 A1* | 7/2019 | Chen | H03H 3/08 |
| 2020/0162052 A1* | 5/2020 | Matsuoka | H03H 3/08 |
| 2023/0299740 A1* | 9/2023 | Weng | H03H 9/64 |
| 2023/0344408 A1* | 10/2023 | Torazawa | H03H 9/14502 |
| 2024/0171148 A1* | 5/2024 | Zhou | H03H 9/02622 |
| 2024/0195385 A1* | 6/2024 | Zhou | H03H 9/02834 |

FOREIGN PATENT DOCUMENTS

CN  117579029 A  *  2/2024

* cited by examiner

*Primary Examiner* — J. San Martin
(74) *Attorney, Agent, or Firm* — Leason Ellis LLP

(57) ABSTRACT

A surface acoustic wave resonator device and method for manufacturing the same, and filter, the surface acoustic wave resonator device includes an interdigital electrode body region, and including: a piezoelectric substrate; a first interdigital electrode, a first interdigital electrode connection part and a first interdigital electrode lead-out part electrically connected to each other; a second interdigital electrode, a second interdigital electrode connection part and a second interdigital electrode lead-out part electrically connected to each other; and a spanning structure; wherein the first and second interdigital electrode connection parts are respectively located on opposite sides of the interdigital electrode body region; the first interdigital electrode connection part contacts the first interdigital electrode and is electrically isolated from the second interdigital electrode through the spanning structure; the second interdigital electrode connection part contacts the second interdigital electrode and is electrically isolated from the first interdigital electrode through the spanning structure.

20 Claims, 6 Drawing Sheets

SURFACE ACOUSTIC WAVE RESONATOR DEVICE AND METHOD FOR MANUFACTURING THE SAME, AND FILTER

CROSS-REFERENCE TO RELATED APPLICATION(S)

The application claims priority to the Chinese patent application No. 202311336912.1, filed on Oct. 17, 2023, the entire disclosure of which is incorporated herein by reference as part of the present application.

TECHNICAL FIELD

The embodiments of the present disclosure relate to a surface acoustic wave resonator device and a method for manufacturing the same, and a filter.

BACKGROUND

With the rapid development of mobile communication technology, filters with resonators as basic units are more and more widely used in communication devices such as smartphones. Surface Acoustic Wave (SAW) filter, as a kind of acoustic wave filter, has the advantages of small size and light weight. In the surface acoustic wave resonator, a clutter wave may exist, and the clutter wave can be suppressed by disposing a metal structure above the interdigital electrodes. However, such a metal structure may adversely affect the reliability of the resonator device while suppressing clutter.

SUMMARY

At least one embodiment of the present disclosure provides a surface acoustic wave resonator device, including an interdigital electrode body region, and including: a piezoelectric substrate; a first interdigital electrode structure and a second interdigital electrode structure, disposed on a side of the piezoelectric substrate and electrically isolated from each other, wherein the first interdigital electrode structure includes a first interdigital electrode, a first interdigital electrode connection part and a first interdigital electrode lead-out part that are electrically connected to each other, and the second interdigital electrode structure includes a second interdigital electrode, a second interdigital electrode connection part and a second interdigital electrode lead-out part that are electrically connected to each other; wherein the first interdigital electrode and the second interdigital electrode extend along a first direction and are alternately arranged along a second direction, the first direction and the second direction intersect each other; each interdigital electrode of the first interdigital electrode and the second interdigital electrode includes a body portion located in the interdigital electrode body region, and has a first end and a second end opposite to each other in the first direction; the first interdigital electrode connection part and the first interdigital electrode lead-out part are respectively connected to the first end and the second end of the first interdigital electrode, and the second interdigital electrode connection part and the second interdigital electrode lead-out part are respectively connected to the first end and the second end of the second interdigital electrode; and a spanning structure, located between the first interdigital electrode connection part and the second interdigital electrode and between the second interdigital electrode connection part and the first interdigital electrode in a direction perpendicular to a main surface of the piezoelectric substrate; wherein the first interdigital electrode connection part and the second interdigital electrode connection part are respectively located on opposite sides of the interdigital electrode body region in the first direction, and extend continuously along the second direction; the first interdigital electrode connection part is in contact with the first interdigital electrode and electrically isolated from the second interdigital electrode through the spanning structure; and the second interdigital electrode connection part is in contact with the second interdigital electrode and electrically isolated from the first interdigital electrode through the spanning structure.

In the surface acoustic wave resonator device provided by at least one embodiment of the present disclosure, the spanning structure includes a first spanning layer and a second spanning layer respectively located on opposite sides of the interdigital electrode body region in the first direction; orthographic projections of the first interdigital electrode, the first spanning layer and the second interdigital electrode connection part on the piezoelectric substrate partially overlap each other; and orthographic projections of the second interdigital electrode, the second spanning layer and the first interdigital electrode connection part on the piezoelectric substrate partially overlap each other.

In the surface acoustic wave resonator device provided by at least one embodiment of the present disclosure, overlapping portions of the orthographic projection of the first interdigital electrode and the orthographic projection of the second interdigital electrode connection part are located within a range of the orthographic projection of the first spanning layer; and overlapping portions of the orthographic projection of the second interdigital electrode and the orthographic projection of the first interdigital electrode connection part are located within a range of the orthographic projection of the second spanning layer.

The surface acoustic wave resonator device provided by at least one embodiment of the present disclosure includes a clutter suppression structure, wherein the clutter suppression structure includes at least the first interdigital electrode connection part and the second interdigital electrode connection part, and at least a portion of the clutter suppression structure is in contact with the piezoelectric substrate.

The surface acoustic wave resonator device provided by at least one embodiment of the present disclosure includes: a first electrode layer, disposed on the side of the piezoelectric substrate, wherein the spanning structure is located on the piezoelectric substrate and covers a portion of the first electrode layer; and a second electrode layer, disposed on the side of the piezoelectric substrate and on a side of the spanning structure away from the first electrode layer, wherein the second electrode layer includes a body part and a protruding part, and the protruding part covers the spanning structure and is spaced apart from the portion of the first electrode layer through the spanning structure.

In the surface acoustic wave resonator device provided by at least one embodiment of the present disclosure, at least a portion of the body part of the second electrode layer is at a same level height as the first electrode layer relative to the piezoelectric substrate, and the protruding part protrudes from surfaces of the first electrode layer and the body part at a side away from the piezoelectric substrate in the direction perpendicular to the main surface of the piezoelectric substrate.

In the surface acoustic wave resonator device provided by at least one embodiment of the present disclosure, the first interdigital electrode and the second interdigital electrode connection part are located in different electrode layers of the first electrode layer and the second electrode layer, and the second interdigital electrode and the first interdigital electrode connection part are located in different electrode layers of the first electrode layer and the second electrode layer.

In the surface acoustic wave resonator device provided by at least one embodiment of the present disclosure, the first electrode layer includes the second interdigital electrode and the second interdigital electrode connection part that are integrally formed; and the second electrode layer includes the first interdigital electrode and the first interdigital electrode connection part that are integrally formed.

In the surface acoustic wave resonator device provided by at least one embodiment of the present disclosure, the protruding part includes at least a portion of the first interdigital electrode connection part, and a portion of the first interdigital electrode located between the interdigital electrode body region and the first interdigital electrode lead-out part in the first direction.

In the surface acoustic wave resonator device provided by at least one embodiment of the present disclosure, the first electrode layer includes the first interdigital electrode connection part and the second interdigital electrode connection part; and the second electrode layer includes the first interdigital electrode and the second interdigital electrode.

In the surface acoustic wave resonator device provided by at least one embodiment of the present disclosure, the protruding part of the second electrode layer includes a portion of the first interdigital electrode located between the interdigital electrode body region and the first interdigital electrode lead-out part in the first direction and a portion of the second interdigital electrode located between the interdigital electrode body region and the second interdigital electrode lead-out part in the first direction.

In the surface acoustic wave resonator device provided by at least one embodiment of the present disclosure, the first electrode layer includes the first interdigital electrode and the second interdigital electrode; and the second electrode layer includes the first interdigital electrode connection part and the second interdigital electrode connection part.

In the surface acoustic wave resonator device provided by at least one embodiment of the present disclosure, the protruding part of the second electrode layer includes a portion of the first interdigital electrode connection part overlapping the second interdigital electrode in the direction perpendicular to the main surface of the piezoelectric substrate, and a portion of the second interdigital electrode connection part overlapping the first interdigital electrode in the direction perpendicular to the main surface of the piezoelectric substrate.

In the surface acoustic wave resonator device provided by at least one embodiment of the present disclosure, an orthographic projection of the first interdigital electrode on the piezoelectric substrate and an orthographic projection of the first interdigital electrode connection part on the piezoelectric substrate overlap each other, or border on each other but do not overlap; an orthographic projection of the second interdigital electrode on the piezoelectric substrate and an orthographic projection of the second interdigital electrode connection part on the piezoelectric substrate overlap each other, or border on each other but do not overlap.

In the surface acoustic wave resonator device provided by at least one embodiment of the present disclosure, the first interdigital electrode includes a first interdigital electrode additional part, and an orthographic projection of the first interdigital electrode additional part on the piezoelectric substrate overlaps an orthographic projection of the first interdigital electrode connection part on the piezoelectric substrate, and a width of the first interdigital electrode additional part in the second direction is greater than or equal to a width of the body portion of the first interdigital electrode in the second direction; and/or the second interdigital electrode includes a second interdigital electrode additional part, and an orthographic projection of the second interdigital electrode additional part on the piezoelectric substrate overlaps an orthographic projection of the second interdigital electrode connection part on the piezoelectric substrate, and a width of the second interdigital electrode additional part in the second direction is greater than or equal to a width of the body portion of the second interdigital electrode in the second direction.

In the surface acoustic wave resonator device provided by at least one embodiment of the present disclosure, the spanning structure includes a plurality of first spanning patterns and a plurality of second spanning patterns respectively located on opposite sides of the interdigital electrode body region in the first direction; and the plurality of first spanning patterns and the plurality of second spanning patterns are each arranged at intervals along the second direction, and the spanning structure has a first opening located between adjacent first spanning patterns and a second opening located between adjacent second spanning patterns.

In the surface acoustic wave resonator device provided by at least one embodiment of the present disclosure, in the first electrode layer and the second electrode layer, portions of the second interdigital electrode connection part and the second interdigital electrode that are connected to each other are located in the first opening, and portions of the first interdigital electrode connection part and the first interdigital electrode that are connected to each other are located in the second opening.

The surface acoustic wave resonator device provided by at least one embodiment of the present disclosure further includes: a temperature compensation layer, disposed on the side of the piezoelectric substrate and covers the first interdigital electrode structure, the second interdigital electrode structure and the spanning structure.

In the surface acoustic wave resonator device provided by at least one embodiment of the present disclosure, the temperature compensation layer and the spanning structure include a same material.

In the surface acoustic wave resonator device provided by at least one embodiment of the present disclosure, the temperature compensation layer and the spanning structure include different materials, and a dielectric constant of the spanning structure is greater than a dielectric constant of the temperature compensation layer.

In the surface acoustic wave resonator device provided by at least one embodiment of the present disclosure, a material of the spanning structure is selected from at least one of organic dielectric materials and inorganic dielectric materials.

In the surface acoustic wave resonator device provided by at least one embodiment of the present disclosure, a length of the first interdigital electrode connection part and a length of the second interdigital electrode connection part in the second direction is greater than or equal to a width of the interdigital electrode body region in the second direction.

At least one embodiment of the present disclosure provides a filter, including any one of the abovementioned surface acoustic wave resonator devices.

At least one embodiment of the present disclosure provides a method for manufacturing the surface acoustic wave resonator device, including: forming a first electrode material layer on the piezoelectric substrate, and patterning the first electrode material layer to form a first electrode layer including a plurality of first electrode patterns; forming a spanning structure to cover a portion of the first electrode layer; and forming a second electrode material layer on the piezoelectric substrate and the spanning structure, and patterning the second electrode material layer to form a second electrode layer including a plurality of second electrode patterns, wherein a portion of the second electrode layer and the portion of the first electrode layer overlap each other in a direction perpendicular to the piezoelectric substrate and are electrically isolated from each other through the spanning structure.

In the method for manufacturing the surface acoustic wave resonator device provided by at least one embodiment of the disclosure, the plurality of first electrode patterns include the second interdigital electrode and the second interdigital electrode connection part; and the plurality of second electrode patterns include the first interdigital electrode and the first interdigital electrode connection part.

In the method for manufacturing the surface acoustic wave resonator device provided by at least one embodiment of the disclosure, the plurality of first electrode patterns include the first interdigital electrode connection part and the second interdigital electrode connection part; and the plurality of second electrode patterns include the first interdigital electrode and the second interdigital electrode.

In the method for manufacturing the surface acoustic wave resonator device provided by at least one embodiment of the disclosure, the plurality of first electrode patterns include the first interdigital electrode and the second interdigital electrode; and the plurality of second electrode patterns include the first interdigital electrode connection part and the second interdigital electrode connection part.

In the method for manufacturing the surface acoustic wave resonator device provided by at least one embodiment of the disclosure, the first interdigital electrode lead-out part and the second interdigital electrode lead-out part are each formed in any one of the first electrode layer and the second electrode layer.

BRIEF DESCRIPTION OF DRAWINGS

In order to more clearly explain the technical solution of the embodiments of the present disclosure, the drawings of the embodiments will be briefly introduced below. It is obvious that the drawings in the following description only relate to some embodiments of the present disclosure, but do not intend to limit the present disclosure.

DETAILED DESCRIPTION

Figure 1A:
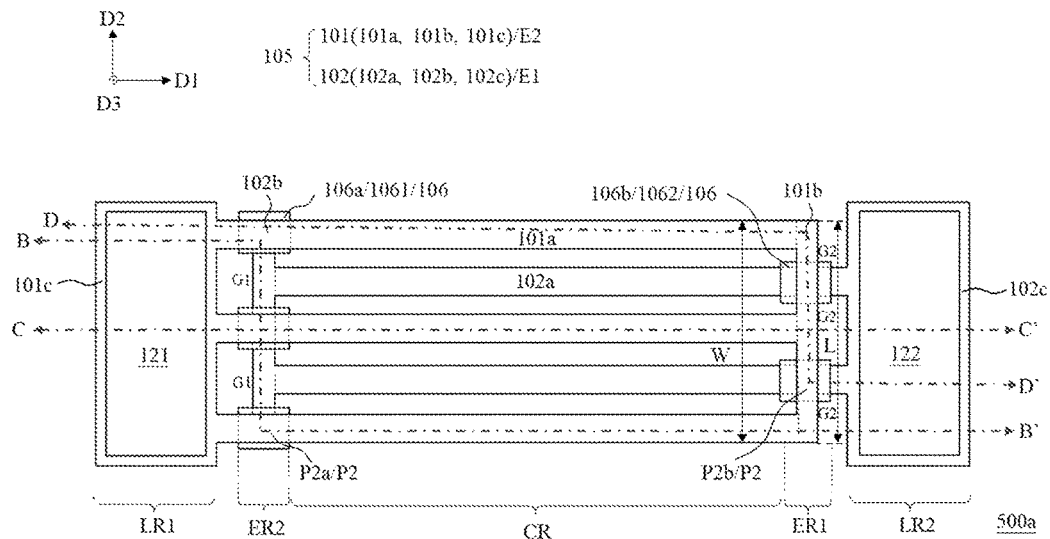
FIG. 1A illustrates a schematic top view of a surface acoustic wave resonator device according to some embodiments of the present disclosure.

In order to make objects, technical solutions and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

The embodiments of the present disclosure provide a surface acoustic wave resonator device, a method for manufacturing the same, and a filter. The surface acoustic wave resonator device includes an interdigital electrode body region, and includes: a piezoelectric substrate; a first interdigital electrode structure and a second interdigital electrode structure that are disposed on a side of the piezoelectric substrate and electrically isolated from each other, wherein the first interdigital electrode structure includes a first interdigital electrode, a first interdigital electrode connection part and a first interdigital electrode lead-out part that are electrically connected to each other, and the second interdigital electrode structure includes a second interdigital electrode, a second interdigital electrode connection part, and a second interdigital electrode lead-out part that are electrically connected to each other; wherein the first interdigital electrode and the second interdigital electrode extend along the first direction and are alternately arranged along the second direction, the first direction and the second direction intersect each other; the body portion of the first interdigital electrode and the body portion of the second interdigital electrode are located in the interdigital electrode body region, and each interdigital electrode has a first end and a second end opposite to each other in the first direction; the first interdigital electrode connection part and the first interdigital electrode lead-out part are respectively connected to the first end and the second end of the first interdigital electrode; the second interdigital electrode connection part and the second interdigital electrode lead-out part are respectively connected to the first end and the second end of the second interdigital electrode; and a spanning structure located between the first interdigital electrode connection part and the second interdigital electrode and between the second interdigital electrode connection part and the first interdigital electrode in a direction perpendicular to the main surface of the piezoelectric substrate; wherein the first interdigital electrode connection part and the second interdigital electrode connection part are respectively located on opposite sides of the interdigital electrode body region in the first direction and extend continuously along the second direction; the first interdigital electrode connection part is in contact with the first interdigital electrode and is electrically isolated from the second interdigital electrode through the spanning structure; and the second interdigital electrode connection part is in contact with the second interdigital electrode and is electrically isolated from the first interdigital electrode through the spanning structure.

The surface acoustic wave resonator device and the method for manufacturing the same, and the filter of the present disclosure at least have the following technical effects: through disposing the first interdigital electrode connection part and the second interdigital electrode connection part, suppression of clutter wave in the resonator device can be achieved, and through the above-described structural configuration, the ability of the first electrode connection part and the second interdigital electrode connection part to suppress clutter wave can be improved on the basis of ensuring that the first interdigital electrode structure and the second interdigital electrode structure are electrically isolated; moreover, the first interdigital electrode connection part and the second interdigital electrode connection part are electrically connected to the first interdigital electrode and the second interdigital electrode, respectively, so that the first interdigital electrode connection part and the first interdigital electrode have an equivalent electrical potential, and the second interdigital electrode connection part and the second interdigital electrode have an equivalent electrical potential; compared to the situation in the traditional resonator device where the metal structure that suppresses clutter wave and the plurality of first and second interdigital electrodes are all spaced apart by a dielectric layer, thereby forming an equivalent capacitance, the resonator device of the present application can avoid or reduce the possibility of capacitive breakdown being occurred when the voltage of the interdigital electrode(s) is high, thereby improving the reliability and device performance of the resonator device and the filter including the same.

Figure 1B:
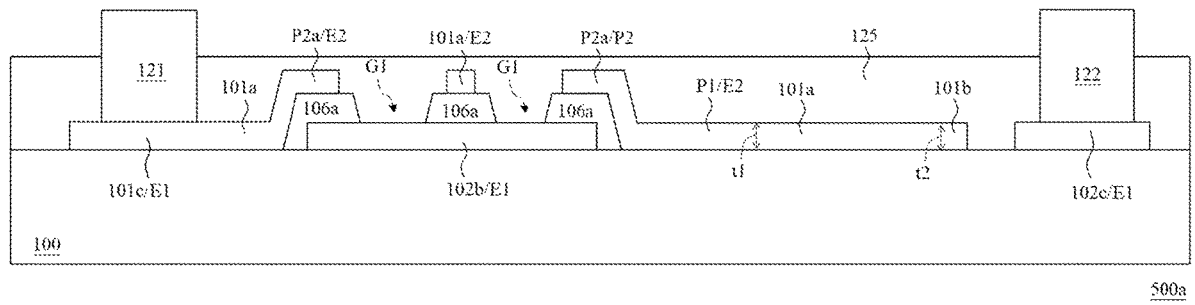
FIG. 1B illustrates a schematic cross-sectional view of a surface acoustic wave resonator device according to some embodiments of the present disclosure taken along a line B-B' of FIG. 1A.
Figure 1C:
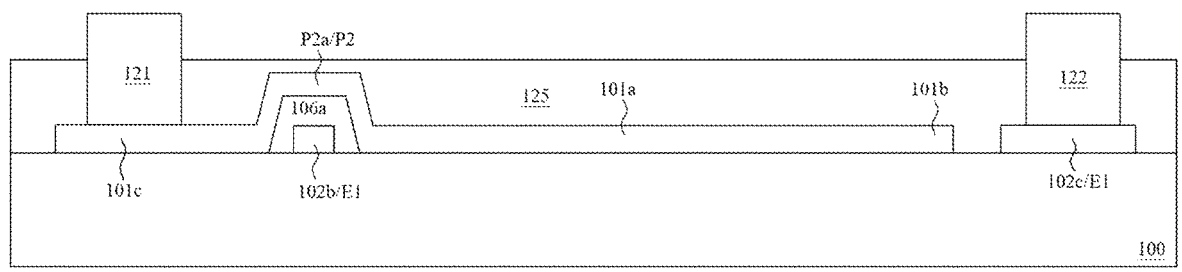
FIG. 1C illustrates a schematic cross-sectional view of a surface acoustic wave resonator device according to some embodiments of the present disclosure taken along a line C-C' of FIG. 1A.

FIG. 1A illustrates a schematic top view of a surface acoustic wave resonator device according to some embodiments of the present disclosure. FIG. 1B and FIG. 1C illustrate schematic cross-sectional views of a surface acoustic wave resonator device according to some embodiments of the present disclosure, and FIG. 1B and FIG. 1C are cross-sectional views repetitively taken along the line B-B' and the line C-C' of FIG. 1A.

Referring to FIG. 1A to FIG. 1C, the surface acoustic wave resonator device 500 includes an interdigital electrode body region CR, a first interdigital electrode end region ER1, a second interdigital electrode end region ER2, a first electrode lead-out region LR1 and a second electrode lead-out region LR2, and includes a piezoelectric substrate 100 and an interdigital transducer 105 and a spanning structure 106 that are disposed on a side of the piezoelectric substrate 100. The interdigital transducer 105 may include a first interdigital electrode structure 101 and a second interdigital electrode structure 102 that are electrically isolated from each other; for example, the first interdigital electrode structure 101 includes one or more first interdigital electrodes 101a, a first interdigital electrode connection part 101b, and a first interdigital electrode lead-out part 101c that are electrically connected to each other; and the second interdigital electrode structure 102 includes one or more second interdigital electrodes 102a, a second interdigital electrode connection part 102b, and a second interdigital electrode lead-out part 102c that are electrically connected to each other.

In a direction (e.g., a first direction D1) parallel to the main surface of the piezoelectric substrate 100, the first interdigital electrode end region ER1 and the second interdigital electrode end region ER2 are located on opposite sides of the interdigital electrode body region CR; the first electrode lead-out region LR1 is located on a side of the second interdigital electrode end region ER2 away from the interdigital electrode body region CR, and the second electrode lead-out region LR1 is located on a side of the first interdigital electrode end region ER1 away from the interdigital electrode body region CR.

In some embodiments, the plurality of first interdigital electrodes 101a and the plurality of second interdigital electrodes 102a extend substantially parallel to each other along the first direction D1 and are spaced apart from each other, and are alternately arranged along the second direction D2. The second direction D2 is parallel to the main surface of the piezoelectric substrate 100 and intersects the first direction D1, for example, the direction D1 and the direction D2 are perpendicular to each other. The body portions of the first interdigital electrodes 101a and the body portions of the second interdigital electrodes 102a are located in the interdigital electrode body region CR, and the body portions of the first interdigital electrodes 101a and the body portions of the second interdigital electrodes 102a overlap each other in the second direction D2. As used herein, two members overlap in a certain direction represents that the orthographic projections of the two members on a reference plane perpendicular to the direction overlap each other.

In some embodiments, the first interdigital electrode connection part 101b and the second interdigital electrode connection part 102b are located on opposite sides of the interdigital electrode body region CR in the first direction D1, and may extend substantially parallel to each other along the second direction D2. For example, each interdigital electrode in the plurality of first interdigital electrodes 101a and the plurality of second interdigital electrodes 102a has a first end and a second end opposite to each other in the first direction D1. The first interdigital electrode connection part 101b and the first interdigital electrode lead-out part 101c are respectively connected to the first ends and the second ends of the first interdigital electrodes 101a; and the second interdigital electrode connection part 102b and the second interdigital electrode lead-out part 102c are respectively connected to the first ends and the second ends of the second interdigital electrodes 102a.

In some embodiments, the spanning structure 106 is located between the first interdigital electrode connection part 101b and the second interdigital electrodes 102a in a direction perpendicular to the main surface of the piezoelectric substrate 100, and between the second interdigital electrode connection part 102b and the first interdigital electrodes 101a. The spanning structure 106 may include a first spanning layer 1061 and a second spanning layer 1062 located on opposite sides of the interdigital electrode body region CR in the first direction D1. In some embodiments, the spanning structure 106 is located outside the interdigital electrode body region CR and does not cover the body portions of the first interdigital electrodes 101a and the body portions of the second interdigital electrodes 102a; that is, the orthographic projection of the spanning structure 106 on the piezoelectric substrate 100 may be offset from the orthographic projection of the body portions of the plurality of interdigital electrodes (including the first interdigital electrodes 101a and the second interdigital electrodes 102a) on the piezoelectric substrate 100. For example, the first spanning layer 1061 and the second spanning layer 1062 may be located in the second interdigital electrode end region ER2 and the first interdigital electrode end region ER1, respectively.

For example, the first interdigital electrode connection part 101b and the second interdigital electrode connection part 102b are respectively located in the first interdigital electrode end region ER1 and the second interdigital electrode end region ER2; the first interdigital electrode connection part 101b extends continuously along the second direction D2, so as to be connected (, e.g., directly connected) with the first ends of the plurality of first interdigital electrodes 101a, and be spaced apart from and electrically isolated from the plurality of second interdigital electrodes 102a through the second spanning layer 1062 of the spanning structure 106; the second interdigital electrode connection part 102b extends continuously along the second direction D2, so as to be connected (e.g., directly connected) with the first ends of the plurality of second interdigital electrodes 102a, and be spaced apart from and electrically isolated from the plurality of first interdigital electrodes 101a through the first spanning layer 1061 of the spanning structure 106. As used herein, two members are "directly connected" represents that the two members are connected by direct contact with each other, without being connected through other intermediate members.

In some embodiments, the orthographic projection of the plurality of first interdigital electrodes 101a on the piezoelectric substrate 100, the orthographic projection of the second interdigital electrode connection part 102b on the piezoelectric substrate 100, and the orthographic projection of first spanning layer 1061 on the piezoelectric substrate 100 partially overlap each other. The orthographic projection of the plurality of second interdigital electrodes 102a on the piezoelectric substrate 100, the orthographic projection of the first interdigital electrode connection part 101b on the piezoelectric substrate 100, and the orthographic projection of the second spanning layer 1062 on the piezoelectric substrate 100 partially overlap each other.

For example, the overlapping portions of the orthographic projection of the first interdigital electrodes 101a and the orthographic projection of the second interdigital electrode connection part 102b is located within the range of the orthographic projection of the first spanning layer 1061; the overlapping portions of the orthographic projection of the second interdigital electrodes 102a and the orthographic projection of the first interdigital electrode connection part 101b is located within the range of the orthographic projection of the second spanning layer 1062. For example, the area of the orthographic projection of the first spanning layer 1061 on the piezoelectric substrate may be greater than the area of the overlapping portion of the orthographic projections of the first interdigital electrodes 101a and the second interdigital electrode connection part 102b; the area of the orthographic projection of the second spanning layer 1062 on the piezoelectric substrate may be greater than the area of the overlapping portion of the orthographic projections of the second interdigital electrodes 102a and the first interdigital electrode connection part 101b, thereby effectively achieving electrical isolation between the first interdigital electrode structure and the second interdigital electrode structure.

In some embodiments, the first interdigital electrode connection part 101b and the second interdigital electrode connection part 102b may have substantially the same length L in the second direction D2, and the length L of the first interdigital electrode connection part 101b and the second interdigital electrode connection part 102b in the second direction D2 may be greater than or equal to the width W of the interdigital electrode body region CR in the second direction D2. As used herein, the width W of the interdigital electrode body region CR in the second direction D2 refers to the distance between the outer sidewalls of two outermost interdigital electrodes (i.e., two end interdigital electrodes) of the plurality of first interdigital electrodes 101a and the plurality of second interdigital electrodes 102a in the second direction D2. The outer sidewall of the end interdigital electrode refers to the sidewall at the side away from other interdigital electrodes in the second direction D2 and is opposite to the inner sidewall thereof facing the adjacent interdigital electrode.

Still referring to FIG. 1A to FIG. 1C, in some embodiments, the first interdigital electrode connection part 101b and the second interdigital electrode connection part 102b constitute a clutter suppression structure, which can, for example, suppress clutter wave (or referred to as transverse wave in spurious mode) propagating in a direction parallel to the extension direction (e.g., the first direction D1) of the interdigital electrodes. For example, during the operation of the surface acoustic wave resonator device 500a, the surface acoustic wave propagates along the arrangement direction (e.g., the second direction D2) of the plurality of first interdigital electrodes 101a and the plurality of second interdigital electrodes 102a of the interdigital transducer 105. However, there may also exist some clutter wave propagating along the extension direction (e.g., the first direction D1) of the interdigital electrodes, and such clutter wave will cause energy loss, and further result in degradation of performance of the resonator and/or the filter including the same. In the embodiments of the present disclosure, the first interdigital electrode connection part 101b and the second interdigital electrode connection part 102b that are respectively connected to the ends of the corresponding interdigital electrodes and extend in the second direction can generate a region or interface where the acoustic wave propagation impedance changes, thereby suppressing clutter wave propagating in the first direction D1, and the clutter wave propagating in the direction D1 can be reflected back into the resonator, thereby reducing energy loss.

The first interdigital electrode connection part 101b and the second interdigital electrode connection part 102b may respectively serve as a first clutter suppression substructure and a second clutter suppression substructure of the clutter suppression structure. That the two clutter suppression substructures extend continuously in the second direction and contact the corresponding interdigital electrodes can improve their ability of suppressing clutter wave. In some embodiments, at least part of the clutter suppression structure is in direct contact with the piezoelectric substrate 100, which can further improve their ability of suppressing clutter wave.

For example, in the clutter suppression structure, at least part of the first interdigital electrode connection part 101b and at least part of the second interdigital electrode connection part 102b are in direct contact with the piezoelectric substrate 100; for example, the entire bottom surface of the second interdigital electrode connection part 102b is in contact with the piezoelectric substrate 100; a part of the bottom surface of the first interdigital electrode connection part 101b is in contact with the piezoelectric substrate 100, and another part of the bottom surface of the first interdigital electrode connection part 101b is in contact with the spanning structure 106.

For example, the surface acoustic wave resonator device may include a first electrode layer E1 and a second electrode plate E2, a portion of the first electrode layer E1 and a portion of the second electrode layer E2 overlap each other in the direction perpendicular to the main surface of the piezoelectric substrate 100. Moreover, the spanning structure 106 is at least located between the overlapping portions of the first electrode layer E1 and the second electrode layer E2, so as to space apart the overlapping portions of the first electrode layer E1 and the second electrode layer E2.

For example, the first electrode layer E1 is disposed on a side of the piezoelectric substrate 100; the spanning structure 106 is located on the piezoelectric substrate 100 and covers the sidewall of a portion of the first electrode layer E1 and the surface thereof at the side away from the piezoelectric substrate; the second electrode layer E2 is disposed on the side of the piezoelectric substrate 100 and is located on a side of the spanning structure 106 away from the first electrode layer E1. For example, the second electrode layer E2 includes a body part P1 and a protruding part P2; the protruding part P2 covers the spanning structure 106 and is isolated from the portion of the first electrode layer E1 covered by the spanning structure through the spanning structure 106; and the body part P1 is a part other than the protruding part P2 of the second electrode layer.

The body part P1 and the first electrode layer E1 may be disposed side by side in a direction (for example, a horizontal direction including the first direction D1 and the second direction D2) parallel to the main surface of the piezoelectric substrate 100, and are spaced apart from each other in this embodiment. The body part P1 and the first electrode layer E1 may be located at the same level height relative to the piezoelectric substrate 100; for example, at least a portion of the body part P1 and the first electrode layer E1 may be located at the same level height relative to the piezoelectric substrate 100. The protruding part P2 protrudes from the surfaces of the first electrode layer E1 and the body part P1 at the side away from the piezoelectric substrate 100 in a direction (e.g., the third direction D3) perpendicular to the main surface of the piezoelectric substrate. As used herein, two members being located at the same level height relative to the piezoelectric substrate represents that at least portions of the two members are substantially at the same distance from the main surface of the piezoelectric substrate in a direction perpendicular to the main surface of the piezoelectric substrate. For example, the main surface of the piezoelectric substrate may be the surface (i.e., the top surface illustrated in the figures) in contact with the interdigital transducer or may be the surface (i.e., the bottom surface illustrated in the figures) at the side away from the interdigital transducer. For example, the distance between the surface of the body part P1 of the second electrode layer E2 facing the piezoelectric substrate and the main surface of the piezoelectric substrate may be substantially equal to the distance between the surface of the first electrode layer E1 facing the piezoelectric substrate and the main surface of the piezoelectric substrate. For example, the distances may all be zero. Alternatively, the distance from the surface of at least a portion (e.g., a portion of the interdigital electrode or the interdigital electrode connection part) of the body part P1 at the side away from the piezoelectric substrate to the top surface of the piezoelectric substrate may be substantially equal to the distance from the surface of at least a portion (e.g., the interdigital electrode or the interdigital electrode connection part) of the first electrode layer E1 at the side away from the piezoelectric substrate to the top surface of the piezoelectric substrate; the above distances are all distances in the direction (for example, the third direction D3) perpendicular to the main surface of the piezoelectric substrate.

In the embodiments of the present disclosure, the first interdigital electrode 101a and the second interdigital electrode connection part 102b are disposed in different electrode layers of the first electrode layer E1 and the second electrode layer E2, and the second interdigital electrode 102a and the first interdigital electrode connection part 101b are disposed in different electrode layers of the first electrode layer E1 and the second electrode layer E2. The first interdigital electrode 101a and the second interdigital electrode 102a may be disposed in the same or different electrode layers; the first interdigital electrode connection part 101b and the second interdigital electrode connection part 102b may be disposed in the same or different electrode layers; the first interdigital electrode lead-out part 101c and the second interdigital electrode lead-out part 102c may each be disposed in any one of the first electrode layer and the second electrode layer, and the first interdigital electrode lead-out part 101c and the second interdigital electrode lead-out part 102c may be, for example, disposed in the same layer as the first interdigital electrode 101a and the second interdigital electrode 102a, respectively.

Referring to FIG. 1A to FIG. 1C, in some embodiments, the first electrode layer E1 may include the first interdigital electrode structure 101, that is, the plurality of first interdigital electrodes 101a, the first interdigital electrode connection part 101b and the first interdigital electrode structure 101 are all disposed in the same first electrode layer E1, and may be integrally formed. The second electrode layer E2 may include the second interdigital electrode structure 102, that is, the plurality of second interdigital electrodes 102a, the second interdigital electrode connection part 102b and the second interdigital electrode lead-out part 102c are all disposed in the same second electrode layer, and may be integrally formed.

In this embodiment, the protruding part P2 of the second electrode layer E2 includes one or more first protruding parts P2a and one or more second protruding parts P2b; for example, the plurality of second protruding parts P2b include a plurality of portions of the first interdigital electrode connection part 101b that overlap the plurality of second interdigital electrodes 102a in the third direction D3, and the plurality of first protruding parts P2a include respective portions of the plurality of first interdigital electrodes 101a that overlap the second interdigital electrode connection parts 102b in the third direction D3.

In the spanning structure 106, at least part of the first spanning layer 1061 is located between the overlapping portions of the plurality of first interdigital electrodes 101a and the second interdigital electrode connection part 102b, so that the plurality of first interdigital electrodes 101a are spaced apart from and electrically isolated from the second interdigital electrode connection part 102b. At least part of the second spanning layer 1062 is located between the overlapping portions of the plurality of second interdigital electrodes 102a and the first interdigital electrode connection part 101b, so that the second interdigital electrodes 102a are spaced apart from and electrically isolated from the first interdigital electrode connection part 101b.

For example, the first spanning layer 1061 includes a plurality of first spanning patterns 106a separated from each other, and has one or more first openings G1; the plurality of first spanning patterns 106a may be arranged at intervals along the second direction D2, and the first openings G1 are located between adjacent first spanning patterns 106a or laterally aside the first spanning patterns 106a in the second direction D2. Each first spanning pattern 106a covers the opposite sidewalls in the first direction D1 of a portion of the second interdigital electrode connection part 102b that overlaps the corresponding one of the first interdigital electrodes 101a and the surface thereof at the side away from the piezoelectric substrate; each first interdigital electrode 101a extends across a corresponding one of the first spanning patterns 106a in the first direction D1, and the first protruding part P2a of the first interdigital electrode 101a is located on the first spanning pattern 106a, thereby being physically and electrically isolated from the second interdigital electrode connection part 102b through the first spanning pattern. In some embodiments, the plurality of first interdigital electrodes 101a and the plurality of first spanning patterns 106a may be disposed in one-to-one correspondence.

For example, the second spanning layer 1062 includes a plurality of second spanning patterns 106b separated from each other, and has one or more second openings G2; the plurality of second spanning patterns 106b may be arranged at intervals along the second direction D2, and the second openings G2 are located between adjacent second spanning patterns 106b or laterally aside the second spanning patterns 106b in the second direction D2. Each second spanning pattern 106b covers the opposite sidewalls in the second direction of a portion of a corresponding second interdigital electrode 102a that overlaps the first interdigital electrode connection part 101b and the surface thereof at the side away from the piezoelectric substrate; the first interdigital electrode connection part 101b extends across the plurality of second spanning patterns 106b and the plurality of second interdigital electrodes 102a in the second direction D2, and the plurality of second protruding parts P2b of the first interdigital electrode connection part 101b, the plurality of second spanning patterns 106b and the plurality of second interdigital electrodes 102a may be disposed in one-to-one correspondence. Each second protruding part P2b is physically and electrically isolated from the second interdigital electrode 102a through the corresponding second spanning pattern 106b.

In some embodiments, in the first electrode layer and the second electrode layer, portions where the second interdigital electrode connection part and the second interdigital electrodes are connected (e.g., directly connected) to each other is located in the first openings of the first spanning layer, and portions where the first interdigital electrode connection part and the first interdigital electrodes are connected (e.g., directly connected) to each other are located in the second openings of the second spanning layer.

For example, as illustrated in FIG. 1A to FIG. 1C, the first opening G1 of the first spanning layer 1061 exposes a portion of the first electrode layer E1, for example, exposes a portion of the first electrode layer where the second interdigital electrode connection part 102b and the second interdigital electrode 102a are directly connected to each other. A portion of the second electrode layer E2 is filled in the second openings G2 of the second spanning layer 1062, and the portion of the second electrode layer E2, for example, includes a portion where the first interdigital electrode connection part 101b and the first interdigital electrodes 101a are directly connected to each other.

In some embodiments, the thicknesses of the first interdigital electrode connection part 101b and the second interdigital electrode connection part 102b may be the same as or different from the thicknesses of the first interdigital electrode 101a and the second interdigital electrode 102a. For example, the thicknesses of the first interdigital electrode connection part 101b and the second interdigital electrode connection part 102b may be greater than the thicknesses of the first interdigital electrode 101a and the second interdigital electrode 102a. In some examples, in the case that the first electrode connection part 101b and the second electrode connection part 102b have a greater thickness, the ability of suppressing clutter wave of the clutter suppression structure constituted by the first interdigital electrode connection part and the second interdigital electrode connection part may be further increased to a certain extent. For example, the body portions of the first interdigital electrodes 101a and the second interdigital electrodes 102a located in the interdigital electrode body region CR may have substantially the same thickness t1, the first interdigital electrode connection part 101b and the second interdigital electrode connection part 102b may have substantially the same thickness t2, and a ratio of the thickness t2 to the thickness t1 may range from approximately 1 to 1.6. However, the present disclosure is not limited thereto.

Figure 2:
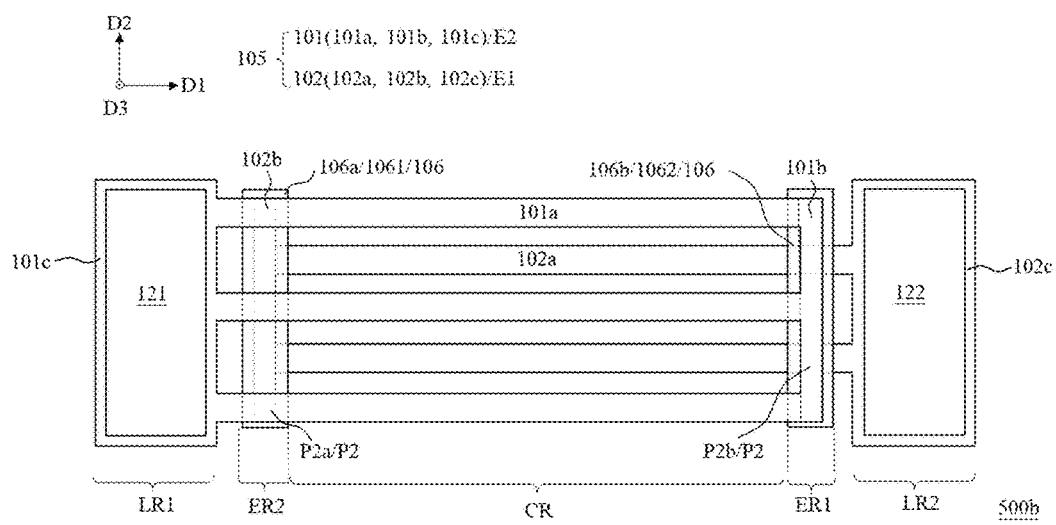
FIG. 2 illustrates a schematic top view of a surface acoustic wave resonator device according to some embodiments of the present disclosure.

FIG. 2 illustrates a schematic top view of a surface acoustic wave resonator device 500b according to some other embodiments of the present disclosure. The surface acoustic wave resonator device 500b is similar to the surface acoustic wave resonator device 500a of the previous embodiments, except that the spanning structure 106 of the surface acoustic wave resonator device 500b is a continuous pattern in each interdigital electrode end region.

Referring to FIG. 2, in some embodiments, the spanning structure 106 includes a first spanning layer 1061 and a second spanning layer 1062. The first spanning layer 1061 and the second spanning layer 1062 extend continuously along the second direction D2 in the second interdigital electrode end region ER2 and the first interdigital electrode end region ER1 respectively. The first spanning layer 1061 is located between the first electrode layer E1 (e.g., the second interdigital electrode connection part 102b) and the second electrode layer E2 (e.g., the plurality of first interdigital electrodes 101a) in the third direction, and the sidewalls of the second interdigital electrode connection part 102b and the surface thereof at the side away from the piezoelectric substrate may be completely covered by the first spanning layer 1061. The second spanning layer 1062 is located between the first electrode layer E1 (e.g., the plurality of second interdigital electrodes 102a) and the second electrode layer E2 (e.g., the first interdigital electrode connection part 101b), and between the second electrode layer E2 (e.g., the first interdigital electrode connection part 101b) and the piezoelectric substrate 100.

Figure 3A:
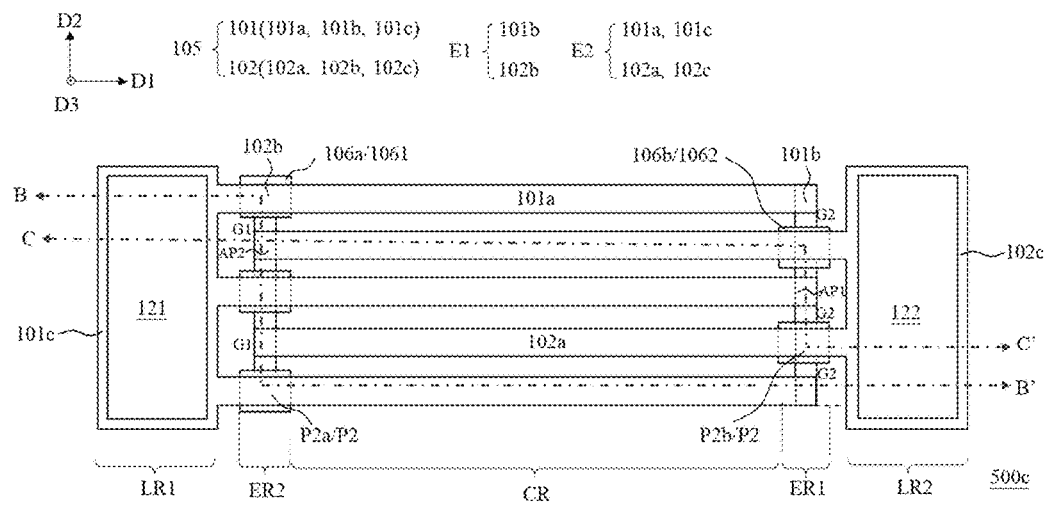
FIG. 3A illustrates a schematic top view of a surface acoustic wave resonator device according to some other embodiments of the present disclosure.
Figure 3B:
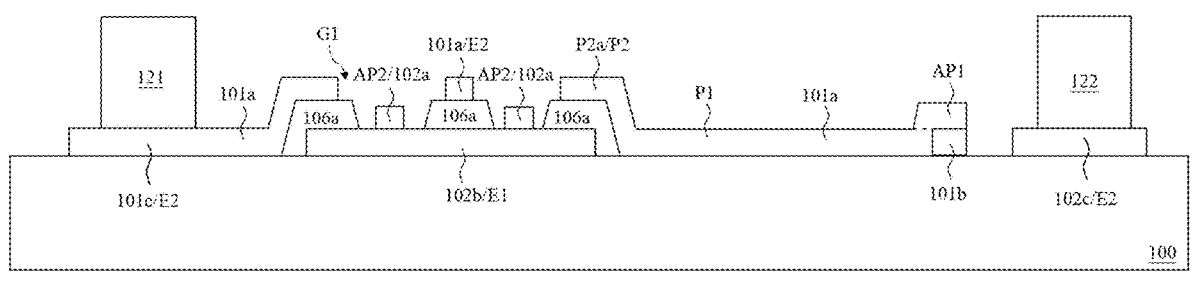
FIG. 3B illustrates a schematic cross-sectional view of a surface acoustic wave resonator device according to some other embodiments of the present disclosure taken along a line B-B' of FIG. 3A.
Figure 3C:
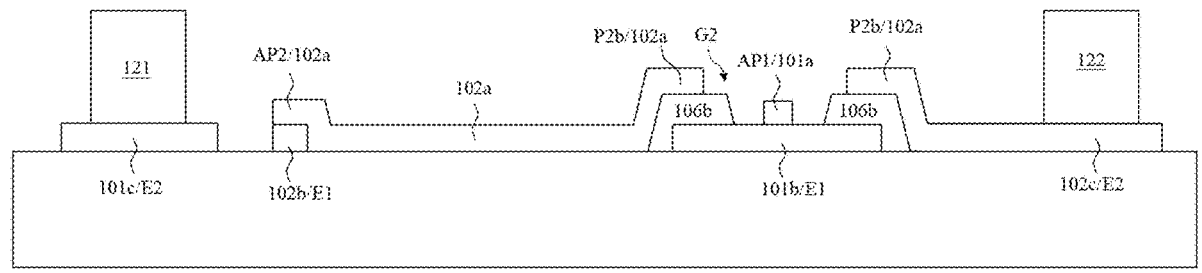
FIG. 3C illustrates a schematic cross-sectional view of a surface acoustic wave resonator device according to some other embodiments of the present disclosure taken along a line C-C' of FIG. 3A.

FIG. 3A illustrates a schematic top view of a surface acoustic wave resonator device 500c according to some other embodiments of the present disclosure. FIG. 3B and FIG. 3C illustrate schematic cross-sectional views of the surface acoustic wave resonator device 500c according to some other embodiments of the present disclosure. FIG. 3B and FIG. 3C are respectively cross-sectional views taken along a line B-B' and a line C-C' of FIG. 3A. The surface acoustic wave resonator device 500c of this embodiment is similar to the aforementioned surface acoustic wave resonator device 500a. The difference lies in that in this embodiment, the positional relationship of the respective interdigital electrodes and the interdigital electrode connection part is different. The differences of this embodiment will be described in detail below, and features similar to the previous embodiments will not be repeated.

Referring to FIG. 3A to FIG. 3C, in some embodiments, the first interdigital electrodes 101a and the first interdigital electrode connection part 101b may be located in different electrode layers; the second interdigital electrodes 102a and the second interdigital electrode connection part 102b may be located in different electrode layers. The first interdigital electrode connection part 101b and the second interdigital electrode connection part 102b may be disposed in the same electrode layer; the plurality of first interdigital electrodes 101a and the plurality of second interdigital electrodes 102a may be disposed in the same electrode layer. As used herein, that two members are "disposed in the same layer" or located in "the same layer" represents that the two members may be formed by a same material layer through a same patterning process.

For example, in some embodiments, the first electrode layer E1 may include at least a first interdigital electrode connection part 101b and a second interdigital electrode connection part 102b. The second electrode layer E2 may include a plurality of first interdigital electrodes 101a, a plurality of second interdigital electrodes 102a, a first interdigital electrode lead-out part 101c, and a second interdigital electrode lead-out part 102c. That is, the first interdigital electrode connection part 101b and the second interdigital electrode connection part 102b may be disposed in the same first electrode layer E1; the plurality of first interdigital electrodes 101a and the plurality of second interdigital electrodes 102a may be disposed in the same second electrode layer E2. The spanning structure 106 is disposed between the first interdigital electrode connection part 101b of the first electrode layer E1 and the plurality of second interdigital electrodes 102a of the second electrode layer E2, and between the second interdigital electrode connection part 102b of the first electrode layer E1 and the plurality of first interdigital electrodes 101a of the second electrode layer E2.

In this example, the first interdigital electrode connection part 101b and the second interdigital electrode connection part 102b of the first electrode layer E1 are respectively in contact with and electrically connected to the plurality of first interdigital electrodes 101a and the plurality of second interdigital electrodes 101a of the second electrode layer E2. For example, the plurality of first interdigital electrodes 101a each extend in the first direction D1 from the first electrode lead-out region LR1 across the second interdigital electrode end region ER2, the interdigital electrode body region CR and extend to the first interdigital electrode end region ER1, so as to be connected to the first interdigital electrode connection part 101b. In some embodiments, the plurality of first interdigital electrodes 101a at least extend to be in contact with the sidewall of the first interdigital electrode connection part 101b; in some examples, the plurality of first interdigital electrodes 101a may further extend to cover and contact the surface (e.g., the top surface illustrated in the figures) of the first interdigital electrode connection part 101b at the side away from the piezoelectric substrate 100. A portion of the first interdigital electrode 101a covering the top surface of the first interdigital electrode connection part 101b may also be referred to as a first interdigital electrode additional part AP1. That is to say, one or more first interdigital electrode additional parts AP1 may be located in the first interdigital electrode end region ER1, and overlap the first interdigital electrode connection part 101b in the third direction D3 perpendicular to the main surface of the piezoelectric substrate 100. For example, the plurality of first interdigital electrode additional parts AP1 may, together with the first interdigital electrode connection part 101b, serve as a part (e.g., a first clutter suppression substructure) of the clutter suppression structure.

One or more second interdigital electrodes 102a each extend in the first direction D1 from the second electrode lead-out region LR2 across the first interdigital electrode end region ER1, the interdigital electrode body region CR and extend to the second interdigital electrode end region ER2, so as to be connected to the second interdigital electrode connection part 102b. In some embodiments, the plurality of second interdigital electrodes 102a at least extend to be in contact with the sidewall of the second interdigital electrode connection part 102b; in some examples, the plurality of second interdigital electrodes 102a may further extend to cover and contact the surface (e.g., the top surface illustrated in the figures) of the second interdigital electrode connection part 102b at the side away from the piezoelectric substrate 100. A portion of the second interdigital electrode 102a covering the top surface of the second interdigital electrode connection part 102b may also be referred to as a second interdigital electrode additional part AP2. That is to say, one or more second interdigital electrode additional parts AP2 may be located in the second interdigital electrode end region ER2, and overlap the second interdigital electrode connection part 102b in the third direction D3 perpendicular to the main surface of the piezoelectric substrate 100. For example, a plurality of second interdigital electrode additional parts AP2 may, together with the second interdigital electrode connection part 101b, serve as a part (e.g., a second clutter suppression substructure) of the clutter suppression structure.

In some embodiments, the sidewall of the first interdigital electrode additional part AP1 at the side away from the body portion of the first interdigital electrode 101a in the first direction D1 may be substantially aligned with the sidewall of the first interdigital electrode connection part 101b facing the second interdigital electrode lead-out part 102c in the third direction D3. The sidewall of the second interdigital electrode additional part AP2 at the side away from the body portion of the second interdigital electrode 102a in the first direction D1 may be substantially aligned with the sidewall of the second interdigital electrode connection part 102b facing the first interdigital electrode lead-out part 101c in the third direction D3. However, the present disclosure is not limited thereto.

In this embodiment, the plurality of protruding parts P2 of the second electrode layer E2 include a plurality of first protruding parts P2a and a plurality of second protruding parts P2b; the spanning structure 106 includes a first spanning layer 1061 having a plurality of first spanning patterns 106a and a second spanning layer 1062 having a plurality of second spanning patterns 106b. The plurality of first protruding parts P2a and the plurality of second protruding parts P2b of the second electrode layer E2 are respectively spaced apart from the corresponding portions of the first electrode layer by the first spanning layer 1061 and the second spanning layer 1062.

The protruding part P2 of the second electrode layer E2 may include a portion of the first interdigital electrode 101a located between the interdigital electrode body region CR and the first interdigital electrode lead-out part 101c in the first direction D1 and a portion of the second interdigital electrode 102a located between the interdigital electrode body region CR and the second interdigital electrode lead-out part 102c in the first direction D1.

For example, the plurality of first protruding parts P2a include portions of the plurality of first interdigital electrodes 101a overlapping with the second interdigital electrode connection part 102b in the third direction D3, and the portions of the plurality of first interdigital electrodes 101a are located between the interdigital electrode body region CR and the first interdigital electrode lead-out region LR1 in the first direction D1. The plurality of first spanning patterns 106a and the plurality of first protruding parts P2a may be disposed in one-to-one correspondence; each first spanning pattern 106a may cover part of the sidewalls (e.g., the opposite sidewalls in the first direction and/or one of the opposite sidewalls in the second direction) of the second interdigital electrode connection part 102b and the surface thereof at the side away from the piezoelectric substrate 100. The first protruding part P2a extends across the corresponding first spanning pattern 106a in the first direction D1, and is spaced apart and electrically isolated from the second interdigital electrode connection part 102b through the first spanning pattern 106a.

For example, the plurality of second protruding parts P2b include portions of the plurality of second interdigital electrodes 102a overlapping with the first interdigital electrode connection part 101b in the third direction D3, and the portions of the plurality of second interdigital electrodes 102a are located between the interdigital electrode body region CR and the second interdigital electrode lead-out region LR2 in the first direction D1. The plurality of second spanning patterns 106b and the plurality of second protruding parts P2b may be disposed in one-to-one correspondence; each second spanning pattern 106b may cover part of the sidewalls (e.g., the opposite sidewalls in the first direction and/or one of the opposite sidewalls in the second direction) of the first interdigital electrode connection part 101b and the surface thereof at the side away from the piezoelectric substrate 100. The second protruding part P2b extends across the corresponding second spanning pattern 106b in the first direction D1, and is spaced apart and electrically isolated from the first interdigital electrode connection part 102a through the second spanning pattern 106b.

In this embodiment, the plurality of first spanning patterns 106a are spaced apart from each other to expose portions of the second interdigital electrode connection part 102b, so that the second interdigital electrodes 102a of the subsequently formed second electrode layer can be connected to the exposed portions of the second interdigital electrode connection part 102b. Likewise, the plurality of second spanning patterns 106b are spaced apart from each other to expose portions of the first interdigital electrode connection part 101b, so that the first interdigital electrodes 101a of the subsequently formed second electrode layer can be connected to the exposed portions of the first interdigital electrode connection part 101b.

For example, in the first spanning layer 1061, the plurality of first spanning patterns 106a are arranged at intervals from each other along the second direction D2; that is, the first spanning layer 1061 has one or more first openings G1 located between adjacent first spanning patterns 106a, or laterally aside the first spanning pattern 106a in the second direction D2. The first opening G1 exposes a portion of the surface of the second interdigital electrode connection part 102b, and the first interdigital electrode 102a extends into the first opening G1 to be connected to the second interdigital electrode connection part 102b. In some embodiments, the second interdigital electrode additional part AP2 of the second interdigital electrode 102a is located in the opening G1 and on the surface of the second interdigital electrode connection part 102b at the side away from the piezoelectric substrate 100.

In some embodiments, the second interdigital electrode additional part AP2 is located laterally aside the first spanning pattern 106a in the second direction D2, and may be spaced apart from the first spanning pattern 106a. The width of the second interdigital electrode additional part AP2 in the second direction D2 may be substantially the same as the width in the second direction D2 of the body portion of the second interdigital electrode 102a located in the interdigital electrode body region CR. However, the present disclosure is not limited thereto.

Referring to FIG. 3A and FIG. 3C, for example, in the second spanning layer 1062, the plurality of second spanning patterns 106b are arranged at intervals along the second direction D2; that is, the second spanning layer 1062 has one or more second openings G2 located between adjacent second spanning patterns 106b, or laterally aside the second spanning pattern 106b in the second direction D2. The second opening G2 exposes a portion of the surface of the first interdigital electrode connection part 101b, and the first interdigital electrode 101a extends into the second opening G2 to be connected to the first interdigital electrode connection part 101b. In some embodiments, the first interdigital electrode additional part AP1 of the first interdigital electrode 101a may be in the second opening G2 and extend to be on the surface of the first interdigital electrode connection part 101b at the side away from the piezoelectric substrate 100.

In some embodiments, the first interdigital electrode additional part AP1 is located laterally aside the second spanning pattern 106b in the second direction D2, and may be spaced apart from the second spanning pattern 106b. The width of the first interdigital electrode additional part AP1 in the second direction D2 may be substantially the same as the width in the second direction D2 of the body portion of the first interdigital electrode 101a located in the interdigital electrode body region CR. However, the present disclosure is not limited thereto.

In some embodiments, the width of each first spanning pattern 106a in the first direction D1 is greater than the width of the second interdigital electrode connection part 102b in the first direction D1, such that the opposite sidewalls of the corresponding portion of the second interdigital electrode connection part 102b in the first direction D1 are both covered by the first spanning pattern 106a. In some embodiments, the width of each first spanning pattern 106a in the second direction D2 is greater than the width of the first interdigital electrode 101a in the second direction D2, such that in the second direction D2, the opposite sidewalls of the first spanning pattern 106a may extend beyond the opposite sidewalls of the corresponding first interdigital electrode 101a. In an alternative embodiment, the width of each first spanning pattern 106a in the second direction D2 may also be substantially equal to the width of the first interdigital electrode 101a in the second direction D2, and the opposite sidewalls of the first spanning pattern 106a in the second direction D2 may be substantially aligned, in the third direction D3, with the opposite sidewalls of the first interdigital electrode 101a in the second direction D2.

Similarly, the width of each second spanning pattern 106b in the first direction D1 may be greater than the width of the first interdigital electrode connection part 101b in the first direction D1, such that the opposite sidewalls of the corresponding portion of the first interdigital electrode connection part 101b in the first direction D1 are both covered by the second spanning pattern 106b. In some embodiments, the width of each second spanning pattern 106b in the second direction D2 is greater than the width of the second interdigital electrode 102a in the second direction D2, such that in the second direction D2, the opposite sidewalls of the second spanning pattern 106b may extend beyond the opposite sidewalls of the corresponding second interdigital electrode 102a. In an alternative embodiment, the width of each second spanning pattern 106b in the second direction D2 may also be substantially equal to the width of the second interdigital electrode 102a in the second direction D2, and the opposite sidewalls of the second spanning pattern 106b in the second direction D2 may be substantially aligned, in the third direction D3, with the opposite sidewalls of the second interdigital electrode 102a in the second direction D2. Through the above size configuration of the first spanning pattern and the second spanning pattern, it can be ensured that the spanning patterns can effectively isolate the first interdigital electrode structure and the second interdigital electrode structure from each other.

Figure 4A:
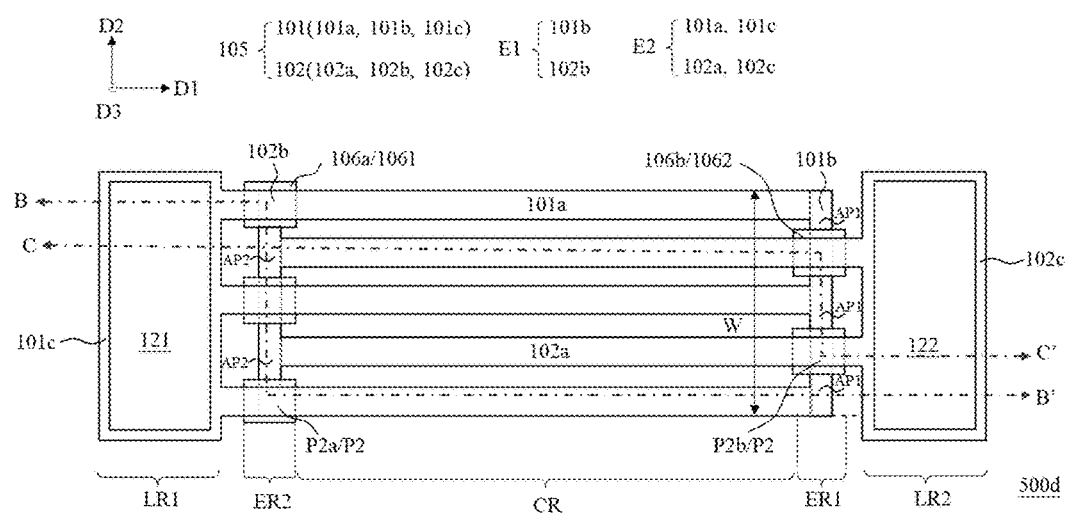
FIG. 4A illustrates a schematic top view of a surface acoustic wave resonator device according to further embodiments of the present disclosure.
Figure 4B:
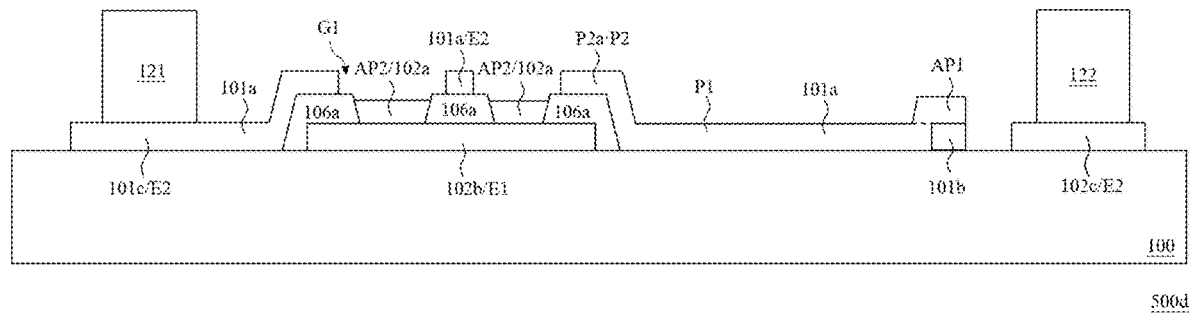
FIG. 4B illustrates a schematic cross-sectional view of a surface acoustic wave resonator device according to further embodiments of the present disclosure taken along a line B-B' of FIG. 4A.
Figure 4C:
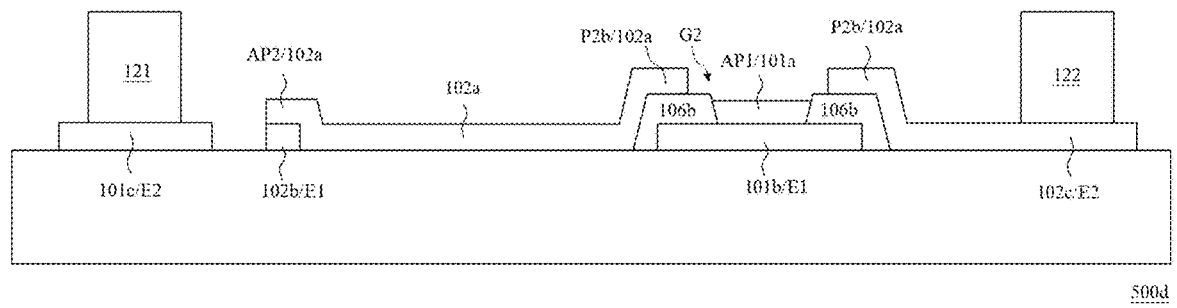
FIG. 4C illustrates a schematic cross-sectional view of a surface acoustic wave resonator device according to further embodiments of the present disclosure taken along a line C-C' of FIG. 4A.

FIG. 4A illustrates a top view of a surface acoustic wave resonator device 500d according to alternative embodiments of the present disclosure, and FIG. 4B and FIG. 4C respectively illustrate cross-sectional views of the surface acoustic wave resonator device 500d according to alternative embodiments of the present disclosure. FIG. 4B and FIG. 4C are cross-sectional views taken along a line B-B' and a line C-C' of FIG. 4A, respectively. The difference between the surface acoustic wave resonator device 500d and the surface acoustic wave resonator device 500c lies in that: in the surface acoustic wave resonator device 500d, the width of the interdigital electrode additional part may be different from the width of the body portion of the corresponding interdigital electrode located in the interdigital electrode body region. The differences between this embodiment and the previous embodiments will be described in detail below, and features the same as those in the previous embodiments are not described again here.

Referring to FIG. 4A to FIG. 4C, in some embodiments, the width of the interdigital electrode additional part in the second direction may be greater than the width of the body portion of the corresponding interdigital electrode located in the interdigital electrode body region in the second direction; the interdigital electrode additional part may extend in the second direction to be in contact with the sidewall of the corresponding spanning pattern; or the interdigital electrode additional part may also be spaced apart from the corresponding spanning pattern without being in contact with the spanning pattern. In the examples where the interdigital electrode additional part contacts the sidewall of the spanning pattern, the spanning pattern may extend beyond the sidewalls of the overlying interdigital electrode thereof in the second direction, and the interdigital electrode additional part does not extend to the surface of the spanning pattern at the side away from the piezoelectric substrate in the third direction, thereby avoiding the interdigital electrode additional part from being connected to another interdigital electrode overlying the spanning pattern; for example, the surface (e.g., the top surface as illustrated in the figures) of the interdigital electrode additional part at the side away from the piezoelectric substrate may be lower than the surface (e.g., the top surface as illustrated in the figures) of the corresponding spanning pattern at the side away from the piezoelectric substrate; that is, the height of the surface of the interdigital electrode additional part at the side away from the piezoelectric substrate relative to the main surface of the piezoelectric substrate is lower than the height of the surface of the corresponding spanning pattern at the side away from the piezoelectric substrate relative to the main surface of the piezoelectric substrate, but the present disclosure is not limited thereto. The position and size of the interdigital electrode additional part can be adjusted according to product requirements and design, as long as the additional part of one of the first interdigital electrode and the second interdigital electrode can be electrically isolated from the other one of the first interdigital electrode and the second interdigital electrode through the corresponding spanning pattern.

For example, as illustrated in FIG. 4A and FIG. 4B, the width of the second interdigital electrode additional part AP2 in the second direction D2 may be greater than the width of the body portion of the second interdigital electrode 102a located in the interdigital electrode body region CR in the second direction D2, and the second interdigital electrode additional part AP2 may be in contact with the sidewall of the first spanning pattern 106a, but the present disclosure is not limited thereto. In an alternative embodiment, the width of the second interdigital electrode additional part AP2 in the second direction D2 is greater than the width of the body portion of the second interdigital electrode 102a in the second direction D2, and the second interdigital electrode additional part AP2 is spaced apart from and not in contact with the first spanning pattern 106a. As illustrated in FIG. 4A and FIG. 4C, the width of the first interdigital electrode additional part AP1 in the second direction D2 may be greater than the width of the first interdigital electrode 101a in the second direction D2, and the first interdigital electrode additional part AP1 may be in contact with the sidewall of the second spanning pattern 106b, but the present disclosure is not limited thereto. In an alternative embodiment, the width of the first interdigital electrode additional part AP1 in the second direction D2 is greater than the width of the body portion of the first interdigital electrode 101a in the second direction D2, and the first interdigital electrode additional part AP1 is spaced apart from and not in contact with the second spanning pattern 106b.

Figure 5A:
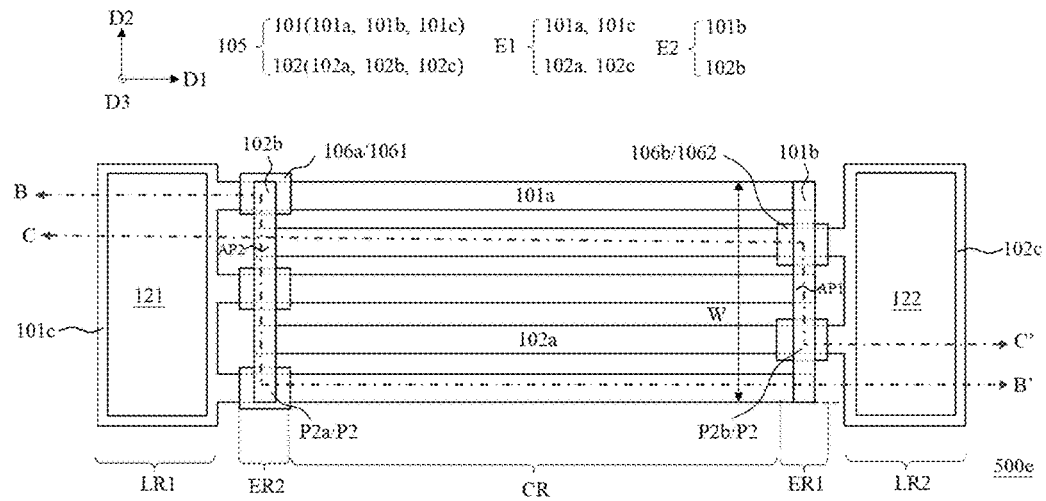
FIG. 5A illustrates a schematic top view of a surface acoustic wave resonator device according to still further embodiments of the present disclosure.
Figure 5B:
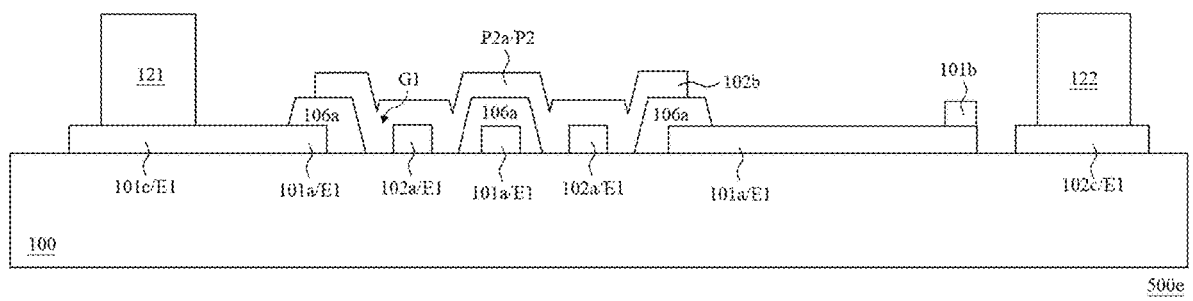
FIG. 5B illustrates a schematic cross-sectional view of a surface acoustic wave resonator device according to still further embodiments of the present disclosure taken along a line B-B' of FIG. 5A.
Figure 5C:
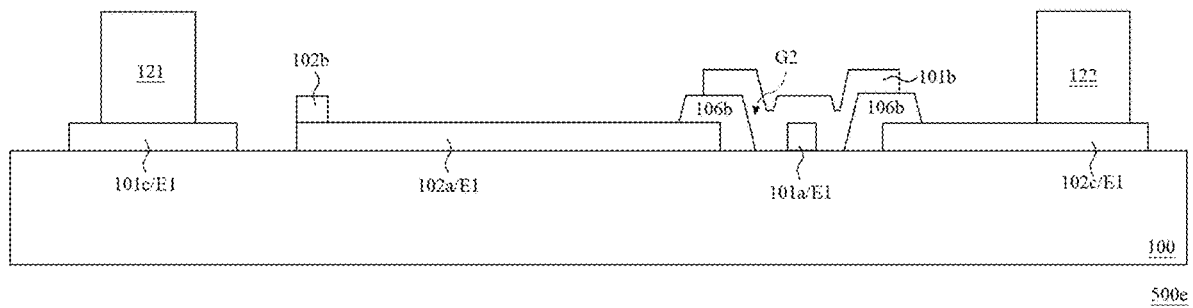
FIG. 5C illustrates a schematic cross-sectional view of a surface acoustic wave resonator device according to still further embodiments of the present disclosure taken along a line C-C' of FIG. 5A.

FIG. 5A illustrates a schematic top view of a surface acoustic wave resonator device 500e according to still some other embodiments of the present disclosure. FIG. 5B and FIG. 5C illustrate schematic cross-sectional views of the surface acoustic wave resonator device 500e according to still some other embodiments of the present disclosure. FIG. 5B and FIG. 5C are cross-sectional views respectively taken along a line B-B' and a line C-C' of FIG. 5A. The surface acoustic wave resonator device 500e of this embodiment is similar to the surface acoustic wave resonator devices described in the previous embodiments. The difference lies in that: in this embodiment, the first interdigital electrodes 101a and the second interdigital electrodes 102a are disposed in the same first electrode layer, while the first interdigital electrode connection part 101b and the second interdigital electrode connection part 102b are disposed in the same second electrode layer E2.

Referring to FIG. 5A to FIG. 5C, in some embodiments, the first electrode layer E1 may include one or more first interdigital electrodes 101a, one or more second interdigital electrodes 102a, a first interdigital electrode lead-out part 101c, and a second interdigital electrode lead-out part 102c. The second electrode layer E2 may include a first interdigital electrode connection part 101b and a second interdigital electrode connection part 102b. The first interdigital electrodes 101a and the second interdigital electrodes 102a may extend from the respective electrode lead-out regions to corresponding interdigital electrode end regions in the first direction D1, and the first interdigital electrode connection part 101b and the second interdigital electrode connection part 102b are respectively located in the corresponding interdigital electrode end regions, and extend across one or more second interdigital electrodes 102a and one or more first interdigital electrodes 101a along the second direction D2, and are respectively connected to the first interdigital electrodes 101a and the second interdigital electrodes 102a.

In some embodiments, the orthographic projection of the first interdigital electrode connection part 101b on the piezoelectric substrate 100 overlaps the orthographic projections of the first interdigital electrodes 101a on the piezoelectric substrate 100, and the first interdigital electrode connection part 101b may cover and contact sidewalls of portions of the first interdigital electrodes 101a located in the end region and surfaces thereof at the side away from the piezoelectric substrate 100. The orthographic projection of the second interdigital electrode connection part 102b on the piezoelectric substrate 100 may overlap the orthographic projections of the second interdigital electrodes 102a on the piezoelectric substrate 100, and the second interdigital electrode connection part 102b may cover and contact sidewalls of portions of the second interdigital electrodes 102a located in the end region and surfaces thereof at the side away from the piezoelectric substrate 100. However, the present disclosure is not limited thereto.

In alternative embodiments, the first interdigital electrodes 101a and the second interdigital electrodes 102a may respectively extend only to positions in the corresponding end regions where they join the subsequently formed interdigital electrode connection parts. In this way, the first interdigital electrode connection part 101b may only contact the sidewalls of the first interdigital electrodes 101a extending along the second direction D2, without covering the surfaces of the first interdigital electrodes at the side away from the piezoelectric substrate; the second interdigital electrode connection part 102b may only contact the sidewalls of the second interdigital electrodes 102a extending along the second direction D2, without covering the surfaces of the second interdigital electrodes at the side away from the piezoelectric substrate; the orthographic projection of the first interdigital electrode connection part 101b on the piezoelectric substrate 100 and the orthographic projection of the first interdigital electrode 101a on the piezoelectric substrate 100 may border (i.e., be connected with, contact) each other but do not overlap; the orthographic projection of the second interdigital electrode connection part 102b on the piezoelectric substrate 100 and the orthographic projection of the second interdigital electrode 102a on the piezoelectric substrate 100 may border each other but do not overlap.

In some embodiments, the first interdigital electrode connection part 101b is electrically isolated from the second interdigital electrodes 102a through the second spanning layer 1062; and the second interdigital electrode connection part 102b is electrically isolated from the first interdigital electrodes 101a through the first spanning layer 1061.

As illustrated in FIG. 5A and FIG. 5B, for example, the first spanning layer 1061 may include one or more first spanning patterns 106a, and the one or more first spanning patterns 106a may be disposed in one-to-one correspondence with the one or more first interdigital electrodes 101a; for example, a plurality of first interdigital electrodes 101a are arranged along the second direction D2, and a plurality of first spanning patterns 106a are also arranged along the second direction D2 and spaced apart from each other. Each first spanning pattern 106a is disposed on a side of the corresponding first interdigital electrode 101a away from the piezoelectric substrate 100, covering opposite sidewalls of the first interdigital electrode 101a in the second direction D2 and the surface thereof at the side away from the piezoelectric substrate 100. The surface (i.e., the bottom surface illustrated in the figures) of the first spanning pattern 106a at the side close to the piezoelectric substrate may be in contact with the piezoelectric substrate 100.

The first spanning layer 1061 has one or more first openings G1, which are disposed on laterally aside the first spanning patterns 106a and/or between adjacent first spanning patterns 106a in the second direction D2. The first opening G1 of the first spanning layer 1061 exposes a portion of the surface of the second interdigital electrode 102a located in the second interdigital electrode end region. The second interdigital electrode connection part 102b is disposed on the first spanning layer 1061, so as to be electrically isolated from the first interdigital electrodes 101a through the first spanning layer 1061, and is filled in the first openings G1 of the first spanning layer 1061, so as to be adjacent to the second interdigital electrodes 102a. For example, the second interdigital electrode connection part 102b may extend continuously in the second direction along the surface of the first spanning layer 1061 and the surfaces of the second interdigital electrodes 102a and/or the piezoelectric substrate 100 exposed in the first openings G1.

As illustrated in FIG. 5A and FIG. 5C, for example, the second spanning layer 1062 may include one or more second spanning patterns 106b, and the one or more second spanning patterns 106b may be disposed in one-to-one correspondence with the one or more second interdigital electrodes 102a; for example, a plurality of second interdigital electrodes 102a are arranged at intervals along the second direction D2, and a plurality of second spanning patterns 106b are also arranged at intervals from each other along the second direction D2. Each second spanning pattern 106b is disposed on a side of the corresponding second interdigital electrode 102a away from the piezoelectric substrate 100, covering opposite sidewalls of the second interdigital electrode 102a in the second direction D2 and the surface thereof at the side away from the piezoelectric substrate. Moreover, the surface (i.e., the bottom surface illustrated in the figures) of the second spanning pattern 106b at the side close to the piezoelectric substrate 100 may be in contact with the piezoelectric substrate 100.

The second spanning layer 1062 has one or more second openings G2 disposed laterally aside the second spanning pattern 106b and/or between adjacent second spanning patterns 106b in the second direction D2. The second opening G2 of the second spanning layer 1062 exposes a portion of the surface of the first interdigital electrode 101a located in the first interdigital electrode end region. The first interdigital electrode connection part 101b is disposed on the second spanning layer 1062, so as to be electrically isolated from the second interdigital electrodes 102a through the second spanning layer 1062, and is filled in the second openings G2 of the second spanning layer 1062 to be connected to the first interdigital electrodes 101a. For example, the first interdigital electrode connection part 101b may extend continuously in the second direction along the surface of the second spanning layer 1062 and the surfaces of the first interdigital electrodes 101a and/or the piezoelectric substrate 100 exposed in the second openings G2.

In the surface acoustic wave resonator devices 500c, 500d, and 500e illustrated in FIG. 3A to FIG. 5B, the first clutter suppression substructure and the second clutter suppression substructure of the clutter suppression structure respectively include the first interdigital connection part and the second interdigital electrode connection part. Besides, the first clutter suppression substructure may further include a portion (e.g., the first interdigital electrode additional part) of the first interdigital electrode that overlaps the first interdigital electrode connection part in the third direction, and the second clutter suppression substructure may further include a portion of the second interdigital electrode that overlaps the second interdigital electrode connection part in the third direction. In some embodiments, such a configuration increases the thicknesses of at least part of the first clutter suppression substructure and at least part of the second clutter suppression substructure in the direction perpendicular to the main surface of the piezoelectric substrate, thereby facilitating further improving the clutter suppression ability of the clutter suppression structure to some extent. In some embodiments, for example, in the surface acoustic wave resonator device 500d, the widths of the corresponding interdigital electrode additional parts in the second direction is increased, thereby increasing the thickened area in the clutter suppression structure and further improving the clutter suppression ability of the clutter suppression structure to some extent.

Referring to FIG. 3A to FIG. 5B, in some embodiments, the surface acoustic wave resonator device may further include a first conductive connector 121 and a second conductive connector 122. The first conductive connector 121 and the second conductive connector 122 are respectively disposed on the first interdigital electrode lead-out part 101c and the second interdigital electrode lead-out part 102c, for example, disposed on sides of the first interdigital electrode lead-out part 101c and the second interdigital electrode lead-out part 102c away from the piezoelectric substrate 100. The first conductive connector 121 and the second conductive connector 122 at least partially overlap or may completely overlap the first interdigital electrode lead-out part 101c and the second interdigital electrode lead-out part 102c in the third direction D3 perpendicular to the main surface of the piezoelectric substrate 100, respectively. The first conductive connector 121 is electrically connected to the first interdigital electrode lead-out part 101c, and electrically connected to the plurality of first interdigital electrodes 101a through the first interdigital electrode lead-out part 101c. The second conductive connector 122 is electrically connected to the second interdigital electrode lead-out part 102c, and electrically connected to the plurality of second interdigital electrodes 102a through the second interdigital electrode lead-out part 102c.

Figure 1D:
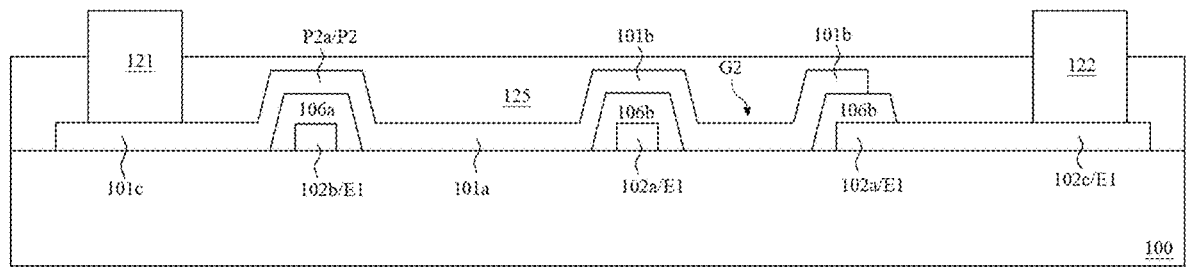
FIG. 1D illustrates a schematic cross-sectional view of a surface acoustic wave resonator device according to some embodiments of the present disclosure taken along a line D-D' of FIG. 1A.

In various embodiments, the surface acoustic wave resonator device may further include a temperature compensation layer. For example, as illustrated in FIG. 1B to FIG. 1D, the temperature compensation layer 125 is disposed on the piezoelectric substrate 100 and covers the interdigital transducer 105 and the spanning structure 106. In some embodiments, the temperature compensation layer 125 may further cover portions of the surfaces (e.g., sidewalls) of the first conductive connector 121 and the second conductive connector 122. The temperature compensation layer 125 may, for example, include silicon oxide. The temperature compensation layer 125 may be in contact with part of the surface of the piezoelectric substrate 100 and may cover the sidewalls of the interdigital transducer and the surface thereof at the side away from the piezoelectric substrate, as well as the sidewalls of the spanning structure and part of the surface thereof at the side away from the piezoelectric substrate. In some embodiments, the material of the spanning structure may be the same as or different from the material of the temperature compensation layer; for example, the material of the spanning structure may be selected from at least one of organic dielectric materials and inorganic dielectric materials, for example, the material of the spanning structure may include a dielectric or insulating material such as silicon oxide, silicon nitride, silicon oxynitride, polyimide, or the like. In some embodiments, the material of the spanning structure is different from the material of the temperature compensation layer, and the spanning structure may select a dielectric material having a high dielectric constant; for example, the dielectric constant of the spanning structure may be greater than the dielectric constant of the temperature compensation layer.

Because the first interdigital electrode connection part and the second interdigital electrode connection part respectively overlap the second interdigital electrodes and the first interdigital electrodes in the third direction, and the spanning structure is located between the first interdigital electrode connection part and the second interdigital electrodes, and between the second interdigital electrode connection part and the first interdigital electrodes. As a result, the first interdigital electrode connection part, the second spanning layer and the second interdigital electrodes will form a parasitic capacitance structure, and the second interdigital electrode connection part, the first spanning layer and the first interdigital electrodes will form a parasitic capacitance structure. Using a material having a high dielectric constant for the spanning structure can have the following advantages: on the one hand, the insulation ability of the spanning structure is improved, thereby effectively making the first interdigital electrode structure and the second interdigital electrode structure be electrically isolated from each other; on the other hand, under certain voltages, the two electrodes of the parasitic capacitance structure may generate a high electric field, in this case, the spanning material having a high dielectric constant may avoid capacitive breakdown from being occurred, thus ensuring the stability of the first interdigital electrode structure and the second interdigital electrode structure, and improving the reliability and device performance of the resonator device. Therefore, suitable materials may be selected for the temperature compensation layer and the spanning structure respectively, thereby avoiding or greatly reducing the possibility of breakdown being occurred to the dielectric material (i.e., the spanning layer) between the overlap portions of the first interdigital electrode structure and the second interdigital electrode structure while satisfying the temperature compensation performance of the resonator device.

In various embodiments of the present disclosure, the first interdigital electrode lead-out part 101c and the second interdigital electrode lead-out part 102c may each be formed in any one of the first electrode layer E1 and the second electrode layer E2; for example, in the surface acoustic wave resonator devices 500a to 500e illustrated in FIG. 1A to FIG. 5A, the first interdigital electrode lead-out part 101c and the first interdigital electrodes 101a are disposed in the same layer and integrally formed, and the second interdigital electrode lead-out part 102c and the second interdigital electrodes 102a are disposed in the same layer and integrally formed, but the present disclosure is not limited thereto. In alternative embodiments, the first interdigital electrode lead-out part 101c may also be disposed in a different electrode layer from the first interdigital electrodes 101a, and the second interdigital electrode lead-out part 102c may also be disposed in a different electrode layer from the second interdigital electrodes 102a.

The embodiments of the present disclosure provide a method for manufacturing a surface acoustic wave resonator device, including: forming a first electrode material layer on a piezoelectric substrate, and patterning the first electrode material layer to form a first electrode layer including a plurality of first electrode patterns; forming a spanning structure to cover a portion of the first electrode layer; and forming a second electrode material layer on the piezoelectric substrate and the spanning structure, and patterning the second electrode material layer to form a second electrode layer including a plurality of second electrode patterns, wherein a portion of the second electrode layer and a portion of the first electrode layer overlap each other in a direction perpendicular to the piezoelectric substrate, and are electrically isolated from each other through the spanning structure. In some embodiments, forming the spanning structure includes forming a spanning material layer on the piezoelectric substrate on which the first electrode layer is formed, and performing a patterning process on the spanning material layer to form a spanning structure including a first spanning layer and a second spanning layer.

In some embodiments, the piezoelectric substrate may include a suitable piezoelectric material such as a piezoelectric crystal, a piezoelectric ceramic, or the like. For example, the material of the piezoelectric substrate may include aluminum nitride (AlN), doped aluminum nitride, zinc oxide (ZnO), lead zirconate titanate (PZT), lithium niobate ($LiNbO_3$), quartz, potassium niobate ($KNbO_3$), lithium tantalate ($LiTaO_3$), the like or combinations thereof. In some embodiments, the piezoelectric substrate may be a single-layer structure or a multi-layer structure, such as a piezoelectric film composite structure, such as a composite structure of a lithium tantalate piezoelectric film/silicon dioxide/silicon substrate. However, the present disclosure is not limited thereto.

In some embodiments, the first electrode material layer and the second electrode material layer may be the same or different materials, and may each be selected from a metal or a metal alloy, for example, each may include gold, silver, tungsten, titanium, platinum, aluminum, copper, molybdenum, the like, alloys thereof or combinations thereof.

For example, in the method for manufacturing the surface acoustic wave resonator device 500a illustrated in FIG. 1A to FIG. 1C and the surface acoustic wave resonator device 500b illustrated in FIG. 2, the plurality of first electrode patterns of the first electrode layer E1 may include one or more second interdigital electrodes 102a and a second interdigital electrode connection part 102b, and may further include a second interdigital electrode lead-out part 102c; and the plurality of second electrode patterns of the second electrode layer E2 may include one or more first interdigital electrodes 101a and a first interdigital electrode connection part 101b, and may further include a first interdigital electrode lead-out part 101c.

For example, in the method for manufacturing the surface acoustic wave resonator device 500c illustrated in FIG. 3A to FIG. 3C and the surface acoustic wave resonator device 500d illustrated in FIG. 4A to FIG. 4C, the plurality of first electrode patterns of the first electrode layer E1 may include a first interdigital electrode connection part 101b and a second interdigital electrode connection part 102b; and the plurality of second electrode patterns of the second electrode layer E2 may include one or more first interdigital electrodes 101a and one or more second interdigital electrodes 102a, and may further include a first interdigital electrode lead-out part 101c and a second interdigital electrode lead-out part 102c.

For example, in the method for manufacturing the surface acoustic wave resonator device 500e illustrated in FIG. 5A to FIG. 5C, the plurality of first electrode patterns of the first electrode layer E1 may include one or more first interdigital electrodes 101a and one or more second interdigital electrodes 102a, and may further include a first interdigital electrode lead-out part 101c and a second interdigital electrode lead-out part 102c; and the plurality of second electrode patterns of the second electrode layer E2 may include a first interdigital electrode connection part 101b and a second interdigital electrode connection part 102b.

For relevant features and technical effects of the surface acoustic wave resonator devices formed by the manufacturing methods of various embodiments, reference may be made to the content described above with respect to FIG. 1A to FIG. 5B, which are not described again herein.

The embodiments of the present disclosure provide a filter, including any one or more of the above-mentioned surface acoustic wave resonator devices 500a to 500e, and the filter can achieve the technical effects identical to those described above with respect to the surface acoustic wave resonator devices.

In various embodiments of the present disclosure, through disposing two interdigital electrode connection parts in the two interdigital electrode end regions of the surface acoustic wave resonator device, and respectively connecting the two interdigital electrode connection parts to the corresponding interdigital electrodes, the two interdigital electrode connection parts can be used as clutter suppression structures to suppress transverse wave in spurious mode in the resonator device; in some embodiments, at least part of the clutter suppression structure is in direct contact with the piezoelectric substrate, thereby improving clutter suppression ability of the resonator device. Furthermore, compared to a conventional resonator device in which breakdown may be occurred at a high voltage due to the formation of an equivalent capacitance between the clutter suppression structure (e.g., including metal) and the plurality of interdigital electrodes, in the embodiments of the present disclosure, because each interdigital electrode connection part is electrically connected to part of the plurality of first and second interdigital electrodes, that is, has equivalent electrical potential with these interdigital electrodes, the possibility of occurring breakdown can be avoided or reduced. On the other hand, each interdigital electrode connection part is electrically isolated from another interdigital electrode through a spanning layer. In some examples, the spanning layer may be formed of a dielectric material having a high dielectric constant, thereby having good insulating ability and can also avoiding breakdown from being occurred. Therefore, through the above configuration, the clutter suppression ability of the clutter suppression structure in the resonator device can be improved, and the possibility of breakdown being occurred to the dielectric material between the clutter suppression structure and the interdigital electrodes can be avoided or reduced, thereby improving the reliability and device performance of the surface acoustic wave resonator device and the filter including the same.

The following statements should be noted: (1) the accompanying drawings related to the embodiment(s) of the present disclosure involve only the structure(s) in connection with the embodiment(s) of the present disclosure, and other structure(s) can be referred to common design(s); (2) in case of no conflict, features in one embodiment or in different embodiments of the present disclosure can be combined.

The above, are only specific embodiments of the present disclosure, but the scope of protection of the present disclosure is not limited thereto, and any variation or substitution readily conceivable by any person skilled in the art within the technical scope disclosed in the present disclosure shall be covered by the scope of protection of the present disclosure. Accordingly, the scope of protection of the present disclosure shall be defined by the scope of protection of the claims.

The invention claimed is:

1. A surface acoustic wave resonator device, comprising an interdigital electrode body region, and comprising:
   a piezoelectric substrate;
   a first interdigital electrode structure and a second interdigital electrode structure, disposed on a side of the piezoelectric substrate and electrically isolated from each other, wherein the first interdigital electrode structure comprises a first interdigital electrode, a first interdigital electrode connection part and a first interdigital electrode lead-out part that are electrically connected to each other, and the second interdigital electrode structure comprises a second interdigital electrode, a second interdigital electrode connection part and a second interdigital electrode lead-out part that are electrically connected to each other; wherein the first interdigital electrode and the second interdigital electrode extend along a first direction and are alternately arranged along a second direction, the first direction and the second direction intersect each other; each interdigital electrode of the first interdigital electrode and the second interdigital electrode comprises a body portion located in the interdigital electrode body region, and has a first end and a second end opposite to each other in the first direction; the first interdigital electrode connection part and the first interdigital electrode lead-out part are respectively connected to the first end and the second end of the first interdigital electrode, and the second interdigital electrode connection part and the second interdigital electrode lead-out part are respectively connected to the first end and the second end of the second interdigital electrode; and
   a spanning structure, located between the first interdigital electrode connection part and the second interdigital electrode and between the second interdigital electrode connection part and the first interdigital electrode in a direction perpendicular to a main surface of the piezoelectric substrate;
   wherein the first interdigital electrode connection part and the second interdigital electrode connection part are respectively located on opposite sides of the interdigital electrode body region in the first direction, and extend continuously along the second direction; the first interdigital electrode connection part is in contact with the first interdigital electrode and electrically isolated from the second interdigital electrode through the spanning structure; and the second interdigital electrode connection part is in contact with the second interdigital electrode and electrically isolated from the first interdigital electrode through the spanning structure.

2. The surface acoustic wave resonator device according to claim 1, wherein
   the spanning structure comprises a first spanning layer and a second spanning layer respectively located on opposite sides of the interdigital electrode body region in the first direction;
   orthographic projections of the first interdigital electrode, the first spanning layer and the second interdigital electrode connection part on the piezoelectric substrate partially overlap each other; and
   orthographic projections of the second interdigital electrode, the second spanning layer and the first interdigital electrode connection part on the piezoelectric substrate partially overlap each other.

3. The surface acoustic wave resonator device according to claim 2, wherein
   overlapping portions of the orthographic projection of the first interdigital electrode and the orthographic projection of the second interdigital electrode connection part are located within a range of the orthographic projection of the first spanning layer; and
   overlapping portions of the orthographic projection of the second interdigital electrode and the orthographic projection of the first interdigital electrode connection part are located within a range of the orthographic projection of the second spanning layer.

4. The surface acoustic wave resonator device according to claim 1, comprising a clutter suppression structure, wherein the clutter suppression structure comprises at least the first interdigital electrode connection part and the second interdigital electrode connection part, and at least a portion of the clutter suppression structure is in contact with the piezoelectric substrate.

5. The surface acoustic wave resonator device according to claim 1, comprising:
   a first electrode layer, disposed on the side of the piezoelectric substrate, wherein the spanning structure is located on the piezoelectric substrate and covers a portion of the first electrode layer; and
   a second electrode layer, disposed on the side of the piezoelectric substrate and on a side of the spanning structure away from the first electrode layer, wherein the second electrode layer comprises a body part and a protruding part, and the protruding part covers the spanning structure and is spaced apart from the portion of the first electrode layer through the spanning structure.

6. The surface acoustic wave resonator device according to claim 5, wherein at least a portion of the body part of the second electrode layer is at a same level height as the first electrode layer relative to the piezoelectric substrate, and the protruding part protrudes from surfaces of the first electrode layer and the body part at a side away from the piezoelectric substrate in the direction perpendicular to the main surface of the piezoelectric substrate.

7. The surface acoustic wave resonator device according to claim 5, wherein the first interdigital electrode and the second interdigital electrode connection part are located in different electrode layers of the first electrode layer and the second electrode layer, and the second interdigital electrode and the first interdigital electrode connection part are located in different electrode layers of the first electrode layer and the second electrode layer.

8. The surface acoustic wave resonator device according to claim 5, wherein
the first electrode layer comprises the second interdigital electrode and the second interdigital electrode connection part that are integrally formed; and
the second electrode layer comprises the first interdigital electrode and the first interdigital electrode connection part that are integrally formed.

9. The surface acoustic wave resonator device according to claim 8, wherein the protruding part comprises at least a portion of the first interdigital electrode connection part, and a portion of the first interdigital electrode located between the interdigital electrode body region and the first interdigital electrode lead-out part in the first direction.

10. The surface acoustic wave resonator device according to claim 5, wherein
the first electrode layer comprises the first interdigital electrode connection part and the second interdigital electrode connection part; and
the second electrode layer comprises the first interdigital electrode and the second interdigital electrode.

11. The surface acoustic wave resonator device according to claim 10, wherein the protruding part of the second electrode layer comprises a portion of the first interdigital electrode located between the interdigital electrode body region and the first interdigital electrode lead-out part in the first direction and a portion of the second interdigital electrode located between the interdigital electrode body region and the second interdigital electrode lead-out part in the first direction.

12. The surface acoustic wave resonator device according to claim 5, wherein
the first electrode layer comprises the first interdigital electrode and the second interdigital electrode; and
the second electrode layer comprises the first interdigital electrode connection part and the second interdigital electrode connection part.

13. The surface acoustic wave resonator device according to claim 12, wherein the protruding part of the second electrode layer comprises a portion of the first interdigital electrode connection part overlapping the second interdigital electrode in the direction perpendicular to the main surface of the piezoelectric substrate, and a portion of the second interdigital electrode connection part overlapping the first interdigital electrode in the direction perpendicular to the main surface of the piezoelectric substrate.

14. The surface acoustic wave resonator device according to claim 9, wherein
an orthographic projection of the first interdigital electrode on the piezoelectric substrate and an orthographic projection of the first interdigital electrode connection part on the piezoelectric substrate overlap each other, or border on each other but do not overlap;
an orthographic projection of the second interdigital electrode on the piezoelectric substrate and an orthographic projection of the second interdigital electrode connection part on the piezoelectric substrate overlap each other, or border on each other but do not overlap.

15. The surface acoustic wave resonator device according to claim 14, comprising at least one of following features:
the first interdigital electrode comprises a first interdigital electrode additional part, and an orthographic projection of the first interdigital electrode additional part on the piezoelectric substrate overlaps an orthographic projection of the first interdigital electrode connection part on the piezoelectric substrate, and a width of the first interdigital electrode additional part in the second direction is greater than or equal to a width of the body portion of the first interdigital electrode in the second direction; and
the second interdigital electrode comprises a second interdigital electrode additional part, and an orthographic projection of the second interdigital electrode additional part on the piezoelectric substrate overlaps an orthographic projection of the second interdigital electrode connection part on the piezoelectric substrate, and a width of the second interdigital electrode additional part in the second direction is greater than or equal to a width of the body portion of the second interdigital electrode in the second direction.

16. The surface acoustic wave resonator device according to claim 5, wherein the spanning structure comprises a plurality of first spanning patterns and a plurality of second spanning patterns respectively located on opposite sides of the interdigital electrode body region in the first direction; and
the plurality of first spanning patterns and the plurality of second spanning patterns are each arranged at intervals along the second direction, and the spanning structure has a first opening located between adjacent first spanning patterns and a second opening located between adjacent second spanning patterns.

17. The surface acoustic wave resonator device according to claim 1, further comprising:
a temperature compensation layer, disposed on the side of the piezoelectric substrate and covers the first interdigital electrode structure, the second interdigital electrode structure and the spanning structure.

18. The surface acoustic wave resonator device according to claim 17, wherein the temperature compensation layer and the spanning structure comprise a same material; or
the temperature compensation layer and the spanning structure comprise different materials, and a dielectric constant of the spanning structure is greater than a dielectric constant of the temperature compensation layer.

19. A method for manufacturing a surface acoustic wave resonator device, comprising:
forming a first electrode material layer on a piezoelectric substrate, and patterning the first electrode material layer to form a first electrode layer comprising a plurality of first electrode patterns;
forming a spanning structure to cover a portion of the first electrode layer; and
forming a second electrode material layer on the piezoelectric substrate and the spanning structure, and patterning the second electrode material layer to form a second electrode layer comprising a plurality of second electrode patterns, wherein a portion of the second electrode layer and the portion of the first electrode layer overlap each other in a direction perpendicular to the piezoelectric substrate and are electrically isolated from each other through the spanning structure, wherein the surface acoustic wave resonator device comprises an interdigital electrode body region, and comprises:

the piezoelectric substrate;

a first interdigital electrode structure and a second interdigital electrode structure, disposed on a side of the piezoelectric substrate and electrically isolated from each other, wherein the first interdigital electrode structure comprises a first interdigital electrode, a first interdigital electrode connection part and a first interdigital electrode lead-out part that are electrically connected to each other, and the second interdigital electrode structure comprises a second interdigital electrode, a second interdigital electrode connection part and a second interdigital electrode lead-out part that are electrically connected to each other; wherein the first interdigital electrode and the second interdigital electrode extend along a first direction and are alternately arranged along a second direction, the first direction and the second direction intersect each other; each interdigital electrode of the first interdigital electrode and the second interdigital electrode comprises a body portion located in the interdigital electrode body region, and has a first end and a second end opposite to each other in the first direction; the first interdigital electrode connection part and the first interdigital electrode lead-out part are respectively connected to the first end and the second end of the first interdigital electrode, and the second interdigital electrode connection part and the second interdigital electrode lead-out part are respectively connected to the first end and the second end of the second interdigital electrode; and the spanning structure, located between the first interdigital electrode connection part and the second interdigital electrode and between the second interdigital electrode connection part and the first interdigital electrode in a direction perpendicular to a main surface of the piezoelectric substrate;

wherein the first interdigital electrode connection part and the second interdigital electrode connection part are respectively located on opposite sides of the interdigital electrode body region in the first direction, and extend continuously along the second direction; the first interdigital electrode connection part is in contact with the first interdigital electrode and electrically isolated from the second interdigital electrode through the spanning structure; and the second interdigital electrode connection part is in contact with the second interdigital electrode and electrically isolated from the first interdigital electrode through the spanning structure.

20. The method for manufacturing the surface acoustic wave resonator device according to claim 19, wherein the plurality of first electrode patterns comprise the second interdigital electrode and the second interdigital electrode connection part; and the plurality of second electrode patterns comprise the first interdigital electrode and the first interdigital electrode connection part; or the plurality of first electrode patterns comprise the first interdigital electrode connection part and the second interdigital electrode connection part; and the plurality of second electrode patterns comprise the first interdigital electrode and the second interdigital electrode; or the plurality of first electrode patterns comprise the first interdigital electrode and the second interdigital electrode; and the plurality of second electrode patterns comprise the first interdigital electrode connection part and the second interdigital electrode connection part.

* * * * *